(12) United States Patent
Park et al.

(10) Patent No.: US 9,484,219 B2
(45) Date of Patent: Nov. 1, 2016

(54) METHODS OF FABRICATING MEMORY DEVICES USING WET ETCHING AND DRY ETCHING

(71) Applicants: Young-Geun Park, Suwon-si (KR); Wook-Yeol Yi, Hwaseong-si (KR); Sang-Yeol Kang, Suwon-si (KR); Dong-Chan Kim, Anyang-si (KR); Chang-Mu An, Osan-si (KR); Bong-Hyun Kim, Incheon (KR); Han-Jin Lim, Seoul (KR)

(72) Inventors: Young-Geun Park, Suwon-si (KR); Wook-Yeol Yi, Hwaseong-si (KR); Sang-Yeol Kang, Suwon-si (KR); Dong-Chan Kim, Anyang-si (KR); Chang-Mu An, Osan-si (KR); Bong-Hyun Kim, Incheon (KR); Han-Jin Lim, Seoul (KR)

(73) Assignee: Samsung Electronic Co., Ltd. (KR)

( * ) Notice: Subject to any disclaimer, the term of this patent is extended or adjusted under 35 U.S.C. 154(b) by 0 days.

(21) Appl. No.: 14/826,845

(22) Filed: Aug. 14, 2015

(65) Prior Publication Data

US 2016/0064386 A1   Mar. 3, 2016

(30) Foreign Application Priority Data

Aug. 27, 2014 (KR) .......................... 10-2014-0112310

(51) Int. Cl.
*H01L 21/8242* (2006.01)
*H01L 21/311* (2006.01)
*H01L 27/108* (2006.01)

(52) U.S. Cl.
CPC .... *H01L 21/31144* (2013.01); *H01L 21/31111* (2013.01); *H01L 21/31116* (2013.01); *H01L 27/10852* (2013.01)

(58) Field of Classification Search
CPC .............. H01L 27/10847; H01L 27/1085; H01L 27/10852; H01L 27/10855; H01L 27/0733; H01L 27/0805
See application file for complete search history.

(56) References Cited

U.S. PATENT DOCUMENTS

| | | | |
|---|---|---|---|
| 6,617,635 | B2 | 9/2003 | Parekh et al. |
| 7,582,925 | B2 | 9/2009 | Jung et al. |
| 7,998,825 | B2 | 8/2011 | Song et al. |
| 8,026,147 | B2 | 9/2011 | Choi et al. |
| 2005/0272218 | A1 | 12/2005 | Park et al. |
| 2006/0060907 | A1 | 3/2006 | Kim et al. |
| 2007/0120230 | A1 | 5/2007 | Kim et al. |
| 2011/0306208 | A1 | 12/2011 | Lee et al. |
| 2015/0145101 | A1* | 5/2015 | Hsu .................. H01L 27/10814 257/532 |

FOREIGN PATENT DOCUMENTS

KR   10-2005-0117713   12/2005

\* cited by examiner

*Primary Examiner* — Hoai V Pham
(74) *Attorney, Agent, or Firm* — Myers Bigel & Sibley, P.A.

(57) ABSTRACT

A method of fabricating semiconductor devices may include forming a mold structure on a lower layer, the mold structure including an etch stop layer doped at a first impurity concentration, a lower mold layer doped at a second impurity concentration, and an undoped upper mold layer. The method may include forming a trench exposing the lower layer in the mold structure using dry etching, extending a width of the trench in the etch stop layer using wet etching, and forming a first conductive pattern in the extended width trench, wherein an etch rate of the etch stop layer with respect to the dry etching may be smaller than an etch rate of the lower mold layer with respect to the dry etching, and an etch rate of the etch stop layer with respect to the wet etching may be proportional to the first impurity concentration.

20 Claims, 33 Drawing Sheets

METHODS OF FABRICATING MEMORY DEVICES USING WET ETCHING AND DRY ETCHING

CROSS-REFERENCE TO RELATED APPLICATION

This application claims priority under 35 U.S.C. §119 to Korean Patent Application No. 10-2014-0112310, filed on Aug. 27, 2014 in the Korean Intellectual Property Office, the contents of which are herein incorporated by reference in their entirety.

BACKGROUND

1. Technical Field

Example embodiments of the inventive concepts relate to semiconductor devices and methods of fabricating the same.

2. Description of the Related Art

With the recent trend toward large-capacity, highly integrated semiconductor devices, design rules of typical semiconductor devices have been continuously decreasing. This trend may even be found in dynamic random access memory (DRAM) devices, which may be semiconductor memory devices.

For operation of a typical DRAM device, each cell may have capacitance of greater than or equal to a predetermined level. To this end, a dielectric layer having a high dielectric constant may be employed to a capacitor and/or a contact area between a lower electrode of the capacitor and the dielectric layer may be increased.

SUMMARY

According to some embodiments of the present inventive concept, methods of fabricating semiconductor devices are provided. A method may include forming a mold structure on a lower layer. The mold structure may include an etch stop layer doped with a first impurity at a first impurity concentration on the lower layer, a lower mold layer doped with a second impurity at a second impurity concentration on the etch stop layer, and an undoped upper mold layer on the lower mold layer. The method may include forming a first trench exposing the lower layer in the mold structure using dry etching. The method may include forming a second trench in the mold structure using wet etching by extending a width of the first trench in the etch stop layer. The method may include forming a first conductive pattern in the second trench. An etch rate of the etch stop layer with respect to the dry etching may be smaller than an etch rate of the lower mold layer with respect to the dry etching. An etch rate of the etch stop layer with respect to the wet etching may be proportional to the first impurity concentration.

In some example embodiments, the etch rate of the etch stop layer with respect to the wet etching may increase according to an increase in the first impurity concentration.

In some example embodiments, the first impurity and the second impurity may include boron (B).

In some example embodiments, the wet etching may extend a width of the first trench in the lower mold layer.

In some example embodiments, in the upper mold layer, a width of the first trench and a width of the second trench may be substantially equal.

In some example embodiments, the etch rate of the etch stop layer with respect to the dry etching may not be proportional to the first impurity concentration.

In some example embodiments, the etch stop layer may include SiN and the mold layer may include an oxide.

In some example embodiments, the forming of the first conductive pattern may include forming a conductive layer along sidewalls and a bottom surface of the second trench and a top surface of the mold structure, and may include removing the conductive layer formed on the top surface of the mold structure.

In some example embodiments, the forming of the first conductive pattern may include forming a conductive layer filling the second trench in the mold structure, and may include removing the conductive layer formed on the top surface of the mold structure.

In some example embodiments, the method may further include forming a high-k dielectric layer on the first conductive pattern, and forming a second conductive pattern on the high-k dielectric layer.

According to other embodiments of the present inventive concept, methods of fabricating a semiconductor device are provided. A method may include forming an interlayer insulation layer on a substrate. The substrate may include an impurity region. The method may include forming a contact plug connected to the impurity region in the interlayer insulation layer. The method may include forming an etch stop layer doped with an impurity on the interlayer insulation layer, a lower mold layer doped with the impurity on the etch stop layer, and an upper mold layer on the lower mold layer. The method may include forming a trench that exposes the contact plug. The trench may include a first trench portion in the upper mold layer, a second trench portion in the lower mold layer and a third trench portion in the etch stop layer. The method may include extending a width of the second trench portion and a width of the third trench portion. The method may include forming a lower electrode in the first trench portion, the extended width second trench portion and the extended width third trench portion. The method may include, after forming the lower electrode, exposing the etch stop layer by removing the lower mold layer and the upper mold layer. The method may include forming a capacitor dielectric layer and an upper electrode on the lower electrode and on a top surface of the exposed etch stop layer. A ratio of a width of the extended width third trench portion to a width of the extended width second trench portion may be proportional to a concentration of the impurity doped into the etch stop layer.

In some example embodiments, the concentration of the impurity doped into the lower mold layer is constant, and the ratio of the width of the extended width third trench portion to the width of the extended width second trench portion may increase according to an increase in the concentration of the impurity doped into the etch stop layer.

In some example embodiments, the impurity may include boron (B).

In some example embodiments, the forming of the extended width second trench portion and the extended width third trench portion may include selectively etching the etch stop layer and the lower mold layer using wet etching.

In some example embodiments, the upper mold layer may not be substantially etched using the wet etching.

In some example embodiments, the forming of the lower electrode may include forming a lower electrode layer along sidewalls of the first trench portion, sidewalls of the extended width second trench portion, sidewalls of the extended width third trench portion and a top surface of the upper mold layer. The forming of the lower electrode may include forming a sacrificial layer filling the first trench, the extended width second trench portion and the extended width third trench portion. The forming of the lower electrode may include removing a portion of the lower electrode layer on the top surface of the upper mold layer.

In some example embodiments, the capacitor dielectric layer and the upper electrode may be formed along inner sidewalls and outer sidewalls of the lower electrode, respectively.

In some example embodiments, the forming of the lower electrode may include forming a lower electrode layer filling the first trench portion, the extended width second trench portion and the extended width third trench portion on the upper mold layer, and removing the lower electrode layer from the top surface of the upper mold layer.

In some example embodiments, the capacitor dielectric layer and the upper electrode are formed along an outer circumferential surface of the lower electrode.

According to other embodiments of the present inventive concept, there is provided methods of fabricating semiconductor devices. A method may include forming a silicon nitride (SiBN) layer doped with boron on a lower layer, a first oxide layer doped with boron on the silicon nitride layer, and an undoped second oxide layer on the first oxide layer. The lower lay may include a conductive pattern. The method may include forming a first trench sequentially passing through the second oxide layer, the first oxide layer and the silicon nitride layer using dry etching. The method may include forming a second trench sequentially passing through the second oxide layer, the first oxide layer and the silicon nitride layer by simultaneously extending widths of the first trench in the first oxide layer and the silicon nitride layer using wet etching. The method may include forming a lower electrode along sidewalls of the second trench. The method may include exposing outer sidewalls of the lower electrode by removing the first oxide layer and the second oxide layer. The method may include forming a capacitor dielectric layer and an upper electrode along inner sidewalls and outer sidewalls of the lower electrode. A width of the second trench in the silicon nitride layer may be proportional to a concentration of the boron doped into the silicon nitride layer.

In some example embodiments, a width of the first trench in the second oxide layer may be substantially equal to a width of the second trench in the second oxide layer.

In some example embodiments, the wet etching of the forming of the second trench may include using diluted hydrofluoric acid.

In some example embodiments, the capacitor dielectric layer and the upper electrode may be formed along a top surface of the silicon nitride layer.

In some example embodiments, the forming of the first trench may include exposing the conductive pattern.

In some example embodiments, the silicon nitride layer may be formed by atomic layer deposition (ALD).

According to other embodiments of the present inventive concept, semiconductor devices are provided. A semiconductor device may include a lower layer on a substrate. The semiconductor device may include a lower electrode on the lower layer. The lower electrode may include a bottom portion and opposing sidewall portions extending from the bottom portion. The opposing sidewall portions may include a first part connected to the bottom portion, a second part on the first part, and a third part on the second part. The semiconductor device may include a dielectric layer formed along a top surface of the bottom portion and inner sidewalls and outer sidewalls of the protruding portions. The semiconductor device may include an upper electrode formed along the dielectric layer on the dielectric layer. A width between the respective first parts of the opposing sidewall portions at an interface between the first part and the second part of the opposing sidewall portions may be greater than a width between the respective second parts of the opposing sidewall portions at the interface between the first part and the second part of the opposing sidewall portions. A width between the respective second parts of the opposing sidewall portions at an interface between the second part and the third part of the opposing sidewall portions may be greater than a width between the respective third parts of the opposing sidewall portions at the interface between the second part and the third part of the opposing sidewall portions.

In some example embodiments, the semiconductor device may further include an etch stop layer disposed on the lower layer and including an opening. The etch stop layer may include doped boron. The first part may be formed along sidewalls of the opening.

According to other embodiments of the present inventive concept, semiconductor devices are provided. A semiconductor device may include a lower layer on a substrate. The semiconductor device may include a lower electrode on a top surface of the lower layer and including a first part on the lower layer, a second part on the first part, and a third part on the second part. The first part may be connected to the lower layer. The semiconductor device may include a dielectric layer formed along an outer circumferential surface of the lower electrode. The semiconductor device may include an upper electrode formed along the dielectric layer on the dielectric layer. A width between opposing points on an outer surface of the first part at an interface between the first part and the second part may be greater than a width between opposing points on an outer surface of the second part at the interface between the first part and the second part. A width between opposing points on the outer surface of the second part at an interface between the second part and the third part may be greater than a width between opposing points on an outer surface of the third part at the interface between the second part and the third part.

In some example embodiments, the semiconductor device may further include an etch stop layer disposed on the lower layer. The etch stop layer may include doped boron, and the first part may be formed in the etch stop layer.

According to other embodiments of the present inventive concept, methods of fabricating a semiconductor device are provided. A method may include forming an interlayer insulation layer including an electrically conductive contact plug. The method may include forming an etch stop layer doped with an impurity on the interlayer insulation layer. The method may include forming a lower mold layer doped with the impurity on the etch stop layer. The method may include forming an undoped upper mold layer on the lower mold layer. The method may include forming a trench through the upper mold layer, the lower mold layer, and the etch stop layer using a dry etch process. The trench may include a first trench portion in the etch stop layer, a second trench portion in the lower mold layer, and a third trench portion in the upper mold layer and may expose the conductive contact plug. The method may include increasing a width of the first trench portion and a width of the second trench portion with respect to a width of the third trench portion using a wet etch process. A width of the third trench process may not be substantially increased by the wet etch process. The method may include forming a first electrode in the trench and contacting the conductive contact plug. The method may include removing the mold layer to expose portions of the first electrode. The method may include forming a dielectric layer on the first electrode. The method may include forming a second electrode on the dielectric layer. A width after the wet etch process of the first trench portion may be proportional to a concentration of the impurity doped into the etch stop layer.

In some example embodiments, the forming of the first electrode may include forming a conductive layer along sidewalls and a bottom surface of the trench. The forming of the dielectric layer and the forming of the second electrode may include sequentially forming the dielectric layer and the second electrode on inside and outside surfaces of the first electrode.

In some example embodiments, a width after the dry etch process of the first trench portion may not be proportional to the concentration of the impurity doped into the etch stop layer.

In some example embodiments, the upper mold layer may include an oxide, the lower mold layer may include the oxide, and the etch stop layer may include a nitride. The impurity may include boron.

In some example embodiments, the forming of the first electrode may include filling the trench with a conductive material. The forming of the dielectric layer and the forming the second electrode may include sequentially forming the dielectric layer and the second electrode on an outer surface of the first electrode.

BRIEF DESCRIPTION OF THE DRAWINGS

The present inventive concept will become more apparent by describing in detail embodiments thereof with reference to the attached drawings.

DETAILED DESCRIPTION OF THE EMBODIMENTS

Figure 1:
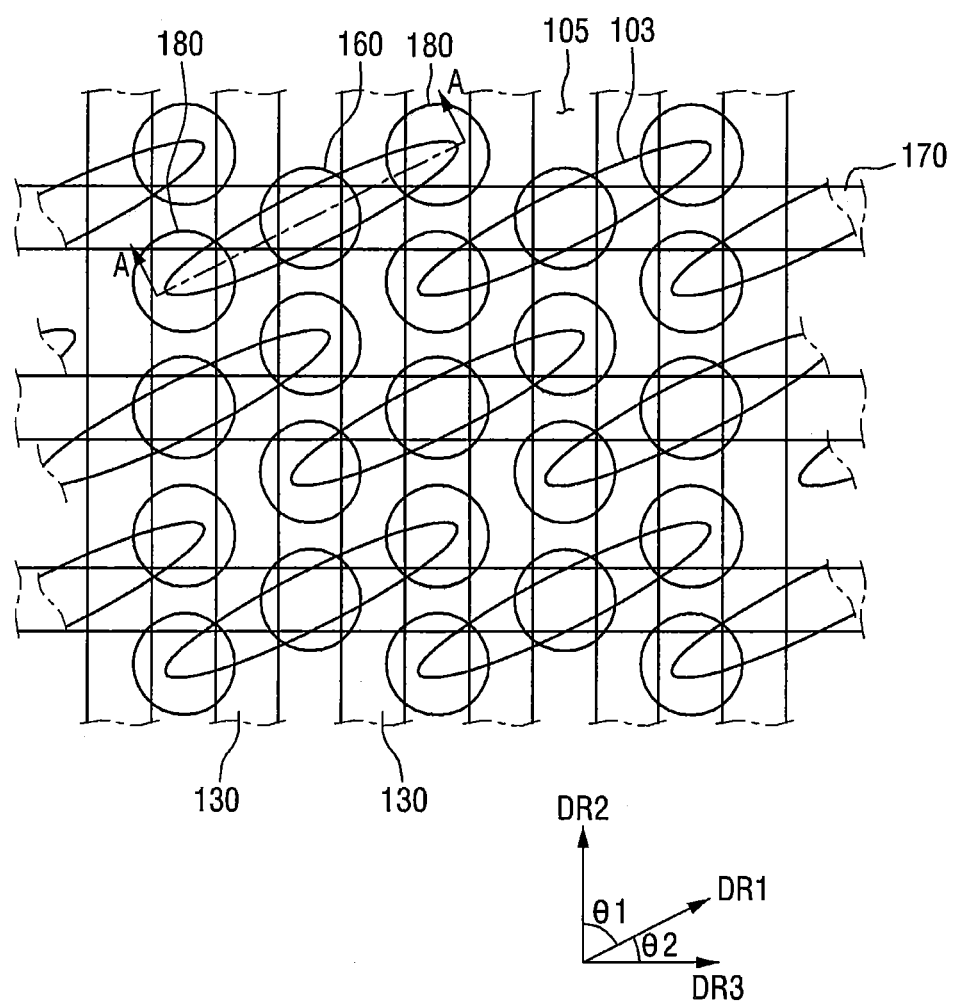
FIG. 1 is a plan view schematically illustrating a layout of a semiconductor device according to some embodiments of the present inventive concept.

Various embodiments of the present inventive concept will now be described more fully hereinafter with reference to the accompanying drawings, in which some embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of devices may be arranged in an array and/or in a two-dimensional pattern.

FIG. 1 is a plan view schematically illustrating a layout of a semiconductor device according to some embodiments of the present inventive concept.

Here, as an exemplary semiconductor device fabricated by the methods of fabricating semiconductor devices according to some embodiments of the present inventive concept, a dynamic random access memory (DRAM) device is illustrated, but aspects of the present disclosure are not limited thereto.

Referring to FIG. 1, in the semiconductor device fabricated by the methods of fabricating semiconductor devices according to some embodiments of the present inventive concept, a unit active region 103 may be defined by forming an isolation region 105 in a substrate 100. In detail, the unit active region 103 may extend in a first direction DR1, a gate electrode (that is, a word line) 130 may extend in a second direction DR2 forming an acute angle with the first direction DR1 and a bit line 170 may extend in a third direction DR3 forming an acute angle with the first direction DR1.

In reference to directions forming "a predetermined angle," the term "angle" used herein may refer to a smaller angle of two angles formed by two directions crossing each other, for example, 60° when angles formed by two directions crossing each other are 120° and 60°. Thus, as shown in FIG. 1, the angle formed by the first direction DR1 and the second direction DR2 is θ1, and the angle formed by the first direction DR1 and the third direction DR3 is θ2.

The extension of active region 103 in the first direction DR1 at acute angles θ1 and/or θ2 relative to the second direction DR2 and the third direction DR3, respectively, may provide a sufficient distance between a bit line contact 160 and a storage node contact 180, the bit line contact 160 connecting the unit active region 103 to the bit line 170 and the storage node contact 180 connecting the unit active region 103 to a capacitor. For example, θ1 and θ2 may be 45° and 45°, 30° and 60°, and/or 60° and 30°, but not limited thereto.

Methods for fabricating semiconductor devices according to some embodiments of the present inventive concept will be described with reference to FIGS. 1 to 8C.

FIGS. 2 and 4A to 8C are cross-sectional views illustrating intermediate process operations in methods for fabricating semiconductor devices according to some embodiments of the present inventive concept. Specifically, FIGS. 2 and 4A to 8C are cross-sectional views taken along the line A-A of FIG. 1. FIG. 3 is a graph illustrating a change in the wet etch rate depending on the concentration of boron (B) doped into an etch stop layer in methods for fabricating semiconductor devices according to some embodiments of the present inventive concept. FIG. 4B is an enlarged view of a portion 'O' of FIG. 4A.

Figure 3:
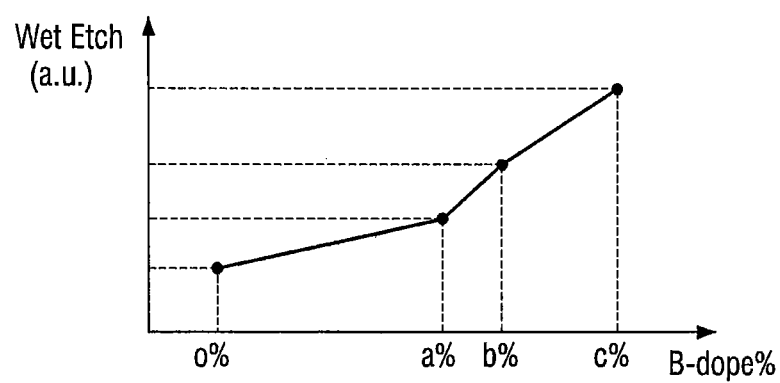
FIG. 3 is a graph illustrating a change in the wet etch rate depending on the concentration of boron (B) doped into an etch stop layer in methods for fabricating semiconductor devices according to some embodiments of the present inventive concept.
Figure 4A:
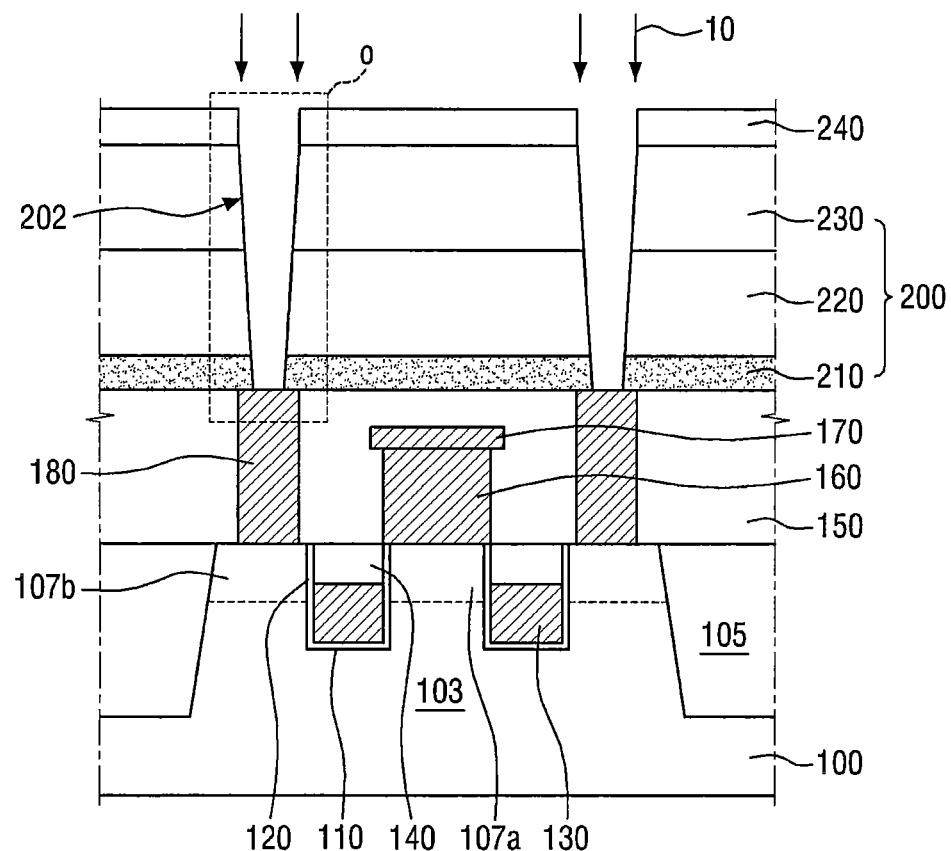
FIG. 4A is a cross-sectional view illustrating intermediate process operations in methods for fabricating semiconductor devices according to some embodiments of the present inventive concept.
Figure 4B:
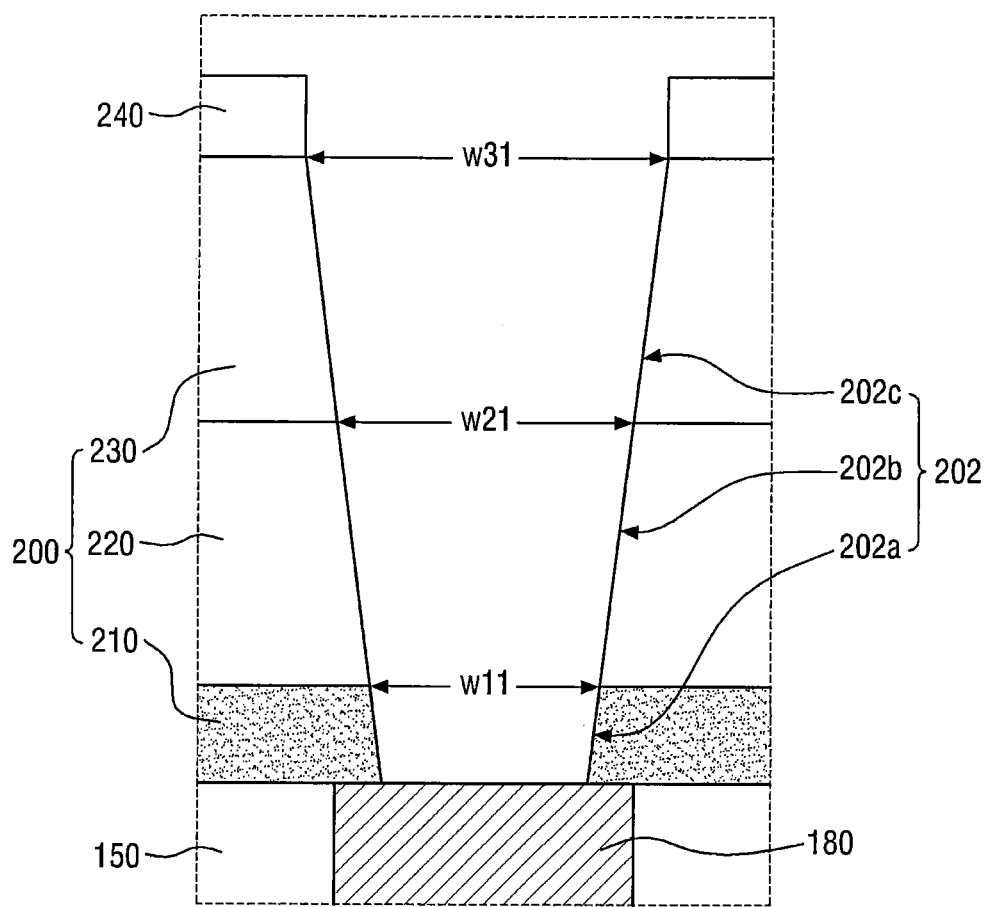
FIG. 4B is an enlarged view of a portion 'O' of FIG. 4A.

In addition, FIGS. 5A to 8C illustrate fabricating process operations performed after the process operations shown in FIG. 4B. FIGS. 5A, 6A, 7A and 8A illustrate process operations for fabricating semiconductor devices when the concentration of boron (B) doped into an etch stop layer is a %, as shown in FIG. 3. FIGS. 5B, 6B, 7B and 8B illustrate process operations for fabricating semiconductor devices when the concentration of boron (B) doped into an etch stop layer is b %, as shown in FIG. 3, b % being greater than a %. FIGS. 5C, 6C, 7C and 8C illustrate process operations for fabricating semiconductor devices when the concentration of boron (B) doped into an etch stop layer is c %, as shown in FIG. 3, c % being greater than b %.

Figure 2:
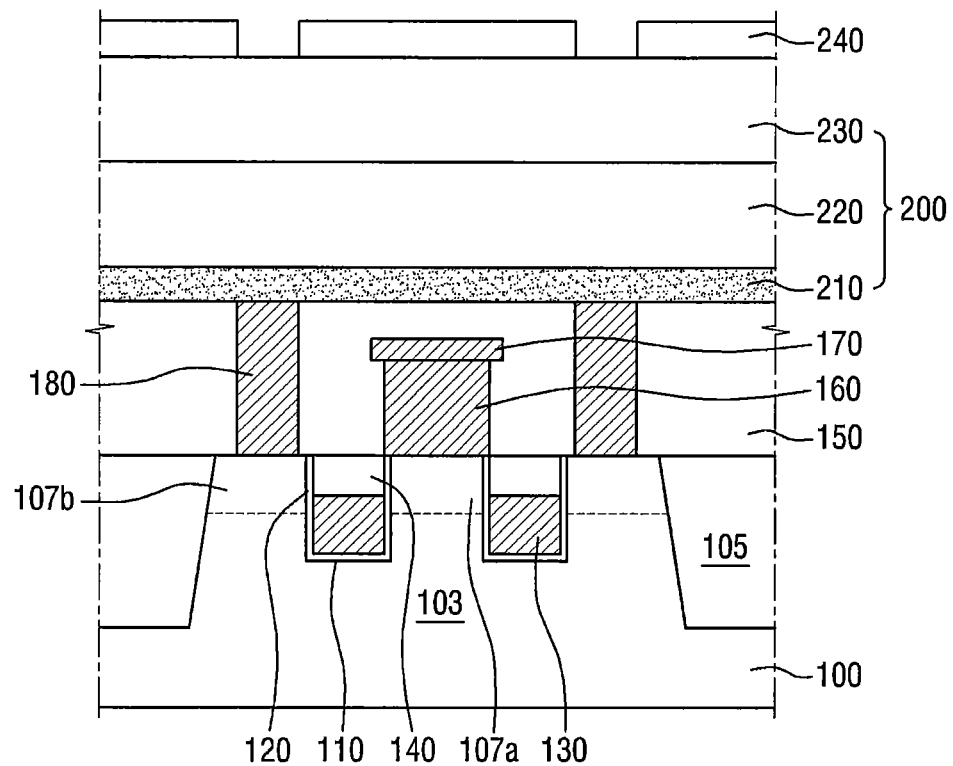
FIG. 2 is a cross-sectional view taken along the line A-A of FIG. 1 illustrating intermediate process operations in methods for fabricating semiconductor devices according to some embodiments of the present inventive concept.

Referring to FIGS. 1 to 3, an isolation region 105 for defining a unit active region 103 may be formed on a substrate 100.

The substrate 100 may have a stacked structure of a base substrate and an epitaxial layer stacked one on another, but not limited thereto. The substrate 100 may be a silicon substrate, a gallium arsenide substrate, a silicon germanium, a ceramic substrate, a quartz substrate and/or a glass substrate for display. Alternatively, the substrate 100 may be a silicon on insulator (SOI) substrate. In the following description, the inventive concept will be described with regard to a silicon substrate by way of example. In addition, the substrate 100 may be of a first conductivity type (e.g., P type), but aspects of the present disclosure are not limited thereto.

The isolation region 105 may include, for example, at least one of oxide, nitride, and oxynitride. In order to improve performance of insulating devices from each other, the isolation region 105 may include a trench insulation layer and a trench liner.

A gate trench 110 may be formed in the substrate 100. The gate trench 110 may be formed to cross the unit active region 103 and the isolation region 105. The gate trench 110 may include a linear shape extending lengthwise in the second direction DR2.

A gate insulation layer 120 may be formed along sidewalls and a bottom surface of the gate trench 110. In addition, a gate electrode 130 may be formed on the gate insulating layer 120, filling at least a portion of the gate trench 110. A capping pattern 140 may be formed, filling the remaining portion of the gate trench 110.

The gate insulation layer 120 may include, for example, silicon oxide, silicon nitride, silicon oxynitride, and/or a high-k material. The high-k material may include, for example, one or more selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but not limited thereto.

The gate electrode 130 may include, for example, at least one of doped polysilicon, titanium nitride (TiN), tantalum nitride (TaN), tungsten nitride (WN), titanium (Ti), tantalum (Ta), and tungsten (W), but aspects of the present disclosure are not limited thereto.

The capping pattern 140 may include an insulating material, for example, at least one of silicon oxide, silicon nitride and silicon oxynitride.

In addition, a first impurity region 107a and a second impurity region 107b may be formed at opposite sides of the gate electrodes 130. The first impurity region 107a may be formed in the unit active region 103 between two gate electrodes 130 formed to cross the unit active region 103. The second impurity region 107b may be formed between the gate electrodes 130 and the isolation region 105. In other words, two transistors formed in the unit active region 103 may share the first impurity region 107a while not sharing the second impurity region 107b.

In FIG. 2, a buried channel array transistor (BCAT) is illustrated as the transistor, but aspects of the present disclosure are not limited thereto. In other words, the transistor may be a planar transistor and/or a vertical channel array transistor (VCAT) formed on the unit active region 103 shaped of a pillar.

An interlayer insulation layer 150 may be formed on the substrate 100. The interlayer insulation layer 150 may include, for example, at least one of silicon oxide, silicon nitride and silicon oxynitride. The interlayer insulation layer 150 may be a single layer or may have a multi-layered structure.

A first contact plug (bit line contact) 160 electrically connected to the first impurity region 107a may be formed in the interlayer insulation layer 150. The first contact plug 160 may include a conductive material, for example, at least one of polysilicon, a metal silicide compound, conductive metal nitride and a metal, but not limited thereto.

A bit line 170 electrically connected to the first impurity region 107a may be formed on the first contact plug 160. The bit line 170 may include a conductive material, for example, at least one of polysilicon, a metal silicide compound, conductive metal nitride and a metal, but not limited thereto.

A second contact plug 180 may be formed in the interlayer insulation layer 150 while passing through the interlayer insulation layer 150. The second contact plug 180 may be electrically connected to the second impurity region 107b. The second contact plug 180 may include a storage node contact. The second contact plug 180 may include a conductive material, for example, at least one of polysilicon, a metal silicide compound, conductive metal nitride and a metal, but not limited thereto.

In FIG. 2, the second contact plug 180 having an integral structure is illustrated, which is, however, provided only for the sake of convenient explanation, but aspects of the present disclosure are not limited thereto. In other words, the second contact plug 180 include a plurality of plugs formed by different process steps that may be connected to one another.

A first mold structure 200 including a first etch stop layer 210 and first mold layers 220 and 230 may be formed on the interlayer insulation layer 150.

The first mold layers 220 and 230 may include a first lower mold layer 220 and a first upper mold layer 230, formed on the first etch stop layer 210. In other words, the first etch stop layer 210, the first lower mold layer 220 and the first upper mold layer 230 may be sequentially formed on the interlayer insulation layer 150.

The first etch stop layer 210 may include a material having etching selectivity to the first lower mold layer 220 and the first upper mold layer 230. In more detail, the first etch stop layer 210 may include a material having dry etching selectivity to the first lower mold layer 220 and the first upper mold layer 230. The first etch stop layer 210 may be formed by, for example, chemical vapor deposition (CVD) and/or atomic layer deposition (ALD).

The first etch stop layer 210 may include, for example, silicon nitride (SiN), specifically silicon nitride (SiN) including doped boron (B). In the methods of fabricating semiconductor devices according to embodiments of the present inventive concept, the etch rate of the silicon nitride (SiN) doped with boron (B) with respect to wet etching may vary according to the concentration of boron (B) doped into the silicon nitride layer.

In more detail, as shown in FIG. 3, in the silicon nitride layer doped with boron (B), the etch rate with respect to wet etching may increase according to the increase in the concentration of boron (B) doped. An etchant used in wet etching the silicon nitride layer doped with boron (B) may include, for example, diluted hydrofluoric acid (HF) with deionized (DI) water, but not limited thereto.

In the methods of fabricating semiconductor devices according to some embodiments of the present inventive concept, the concentration of boron (B) doped into the first etch stop layer 210 may be, for example, greater than or equal to 10% and less than 25%.

However, even if the concentration of boron (B) doped into the first etch stop layer 210 varies, the etch rate of the first etch stop layer 210 with respect to dry etching (10 of FIG. 4A) may be substantially constant.

The first etch stop layer 210 may be formed by atomic layer deposition (ALD), and the concentration of boron (B) doped into the first etch stop layer 210 may be intentionally adjusted. In other words, since a cycle for doping boron (B) into the first etch stop layer 210 may be easily adjusted by ALD, the concentration of boron (B) doped into the first etch stop layer 210 may be intentionally adjusted.

The first mold layers 220 and 230 may include a material having dry etching selectivity to the first etch stop layer 210. In more detail, etch rates of the first mold layers 220 and 230 with respect to dry etching (10 of FIG. 4A) may be greater than an etch rate of the first etch stop layer 210 with respect to dry etching.

The first mold layers 220 and 230 may include, for example, silicon oxide having lower resistance than a silicon nitride layer. The first mold layers 220 and 230 may include, for example, flowable oxide (FOX), tonen silazene (TOSZ), undoped silica glass (USG), borosilicate glass (BSG), phosphosilacate glass (PSG), borophosphosilicate glass (BPSG), plasma enhanced tetra ethyl ortho silicate (PE-TEOS), fluoride silicate glass (FSG), high density plasma (HDP), plasma enhanced oxide (PEOX), flowable CVD (FCVD), and combinations thereof, but aspects of the present disclosure are not limited thereto.

In the methods of fabricating semiconductor devices according to some embodiments of the present inventive concept, the first lower mold layer 220 may include an oxide layer doped with boron (B), and the first upper mold layer 230 may be an undoped oxide layer. Here, the term "undoped oxide layer" does not mean an oxide layer without an impurity but means an oxide layer without an intentionally doped impurity. In other words, the first upper mold layer 230 does not include an intentionally doped impurity.

In the methods of fabricating semiconductor devices according to some embodiments of the present inventive concept, an etch rate of the first lower mold layer 220 with respect to wet etching (20 of FIGS. 5A to 5C) may be different from an etch rate of the first upper mold layer 230 with respect to the wet etching 20. In more detail, the etch rate of the first lower mold layer 220 with respect to the wet etching 20 may be greater than the etch rate of the first upper mold layer 230 with respect to the wet etching 20, which may be because the first lower mold layer 220 may include doped boron (B) but the first upper mold layer 230 may be undoped.

However, an etch rate of the first lower mold layer 220 with respect to the dry etching (10 of FIG. 4A) may be substantially equal to an etch rate of the first upper mold layer 230 with respect to the dry etching 10.

A first mask pattern 240 may be formed on the first mold structure 200. The first mask pattern 240 may include an opening for forming a trench in the first mold structure 200.

Referring to FIGS. 4A and 4B, a first trench 202 may be formed in the first mold structure 200 using the first mask pattern 240. The first trench 202 may be formed using, for example, dry etching 10.

The first trench 202 may expose the interlayer insulation layer 150 positioned under the first mold structure 200. In more detail, the first trench 202 may expose the second contact plug 180 connected to the second impurity region 107b.

In more detail, the first trench 202 may include a first portion 202a of the first trench 202, a second portion 202b of the first trench 202 and a third portion 202c of the first trench 202. The first portion 202a of the first trench 202 may be formed in the first etch stop layer 210, the second portion 202b of the first trench 202 may be formed in the first lower mold layer 220, and the third portion 202c of the first trench 202 may be formed in the first upper mold layer 230.

In other words, the first portion 202a of the first trench 202 in the first etch stop layer 210, the second portion 202b of the first trench 202 in the first lower mold layer 220, and the third portion 202c of the first trench 202 in the first upper mold layer 230 may be sequentially formed by the dry etching 10 using the first mask pattern 240, thereby forming the first trench 202 in the first mold structure 200.

As shown in FIG. 4B, the first portion 202a of the first trench 202 may have a width w11 at a boundary between the first etch stop layer 210 and the first lower mold layer 220, the second portion 202b of the first trench 202 may have a width w21 at a boundary between the first lower mold layer 220 and the first upper mold layer 230, and the third portion 202c of the first trench 202 may have a width w31 at a boundary between the first upper mold layer 230 and the first mask pattern 240.

In addition, sidewalls of the third portion 202c of the first trench 202 and sidewalls of the second portion 202b of the first trench 202 may be substantially continuously aligned in a line. The sidewalls of the second portion 202b of the first trench 202 and sidewalls of the first portion 202a of the first trench 202 may be substantially continuously arranged.

In FIG. 4B, the sidewalls of the second portion 202b of the first trench 202 and the sidewalls of the first portion 202a of the first trench 202 aligned in a line are illustrated, which is, however, provided only for the sake of convenient explanation, but aspects of the present disclosure are not limited thereto. Since the first lower mold layer 220 and the first etch stop layer 210 include different materials, the sidewalls of the second portion 202b of the first trench 202 and the sidewalls of the first portion 202a of the first trench 202 may not be aligned in a line.

Figure 5A:
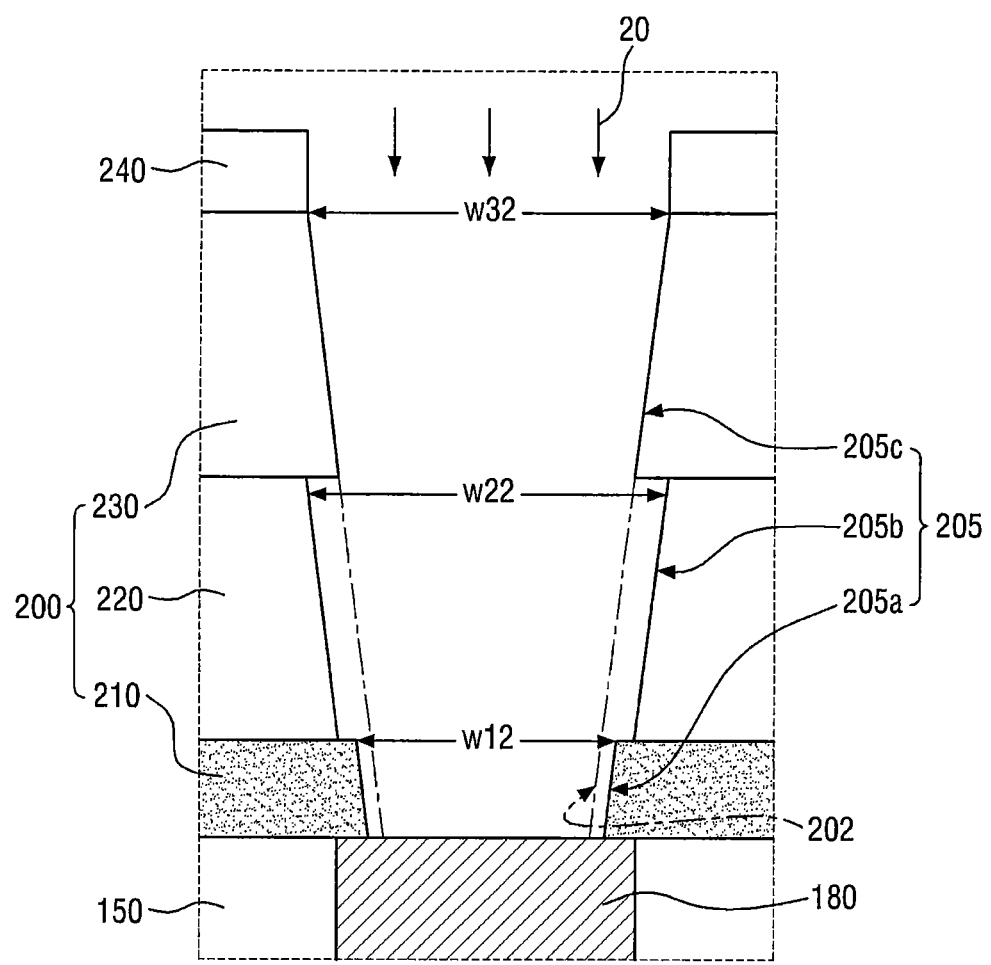
FIGS. 5A-5C, 6A-6C, 7A-7C, and 8A-8C are cross-sectional views illustrating intermediate process operations in methods for fabricating semiconductor devices according to some embodiments of the present inventive concept.
Figure 5B:
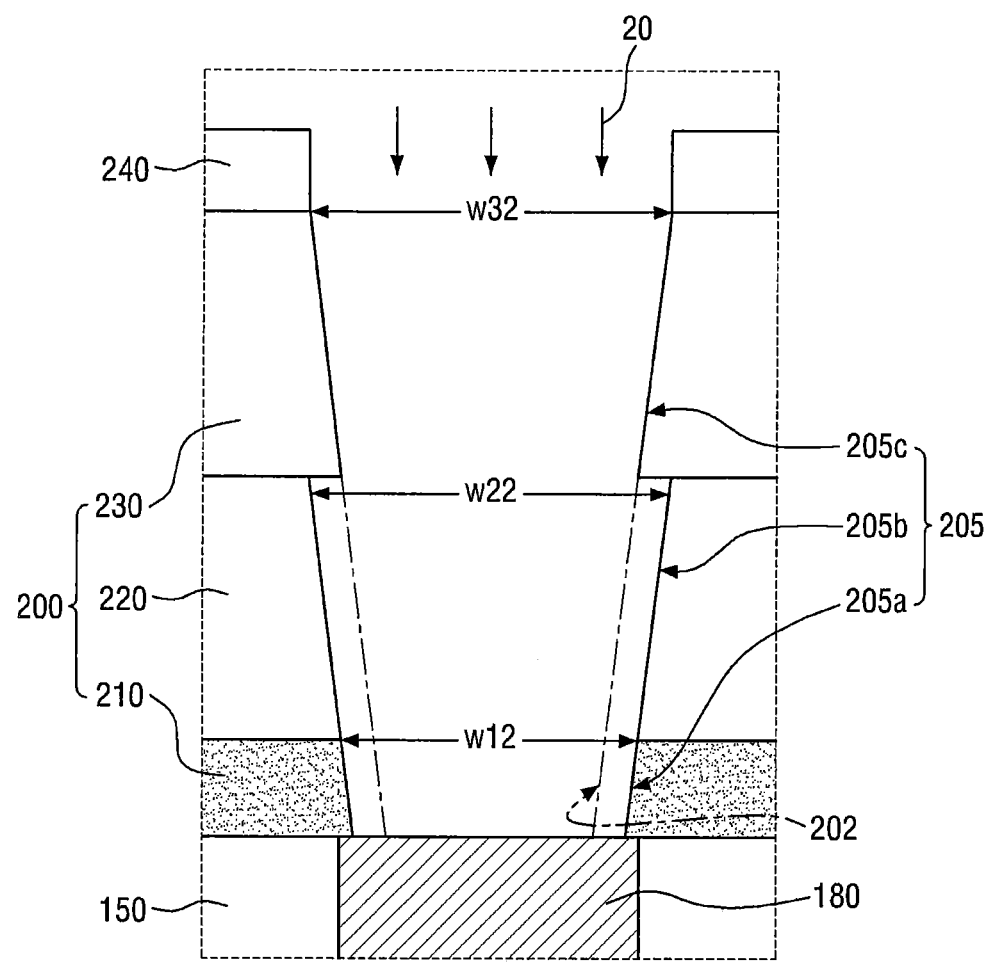
Figure 5C:
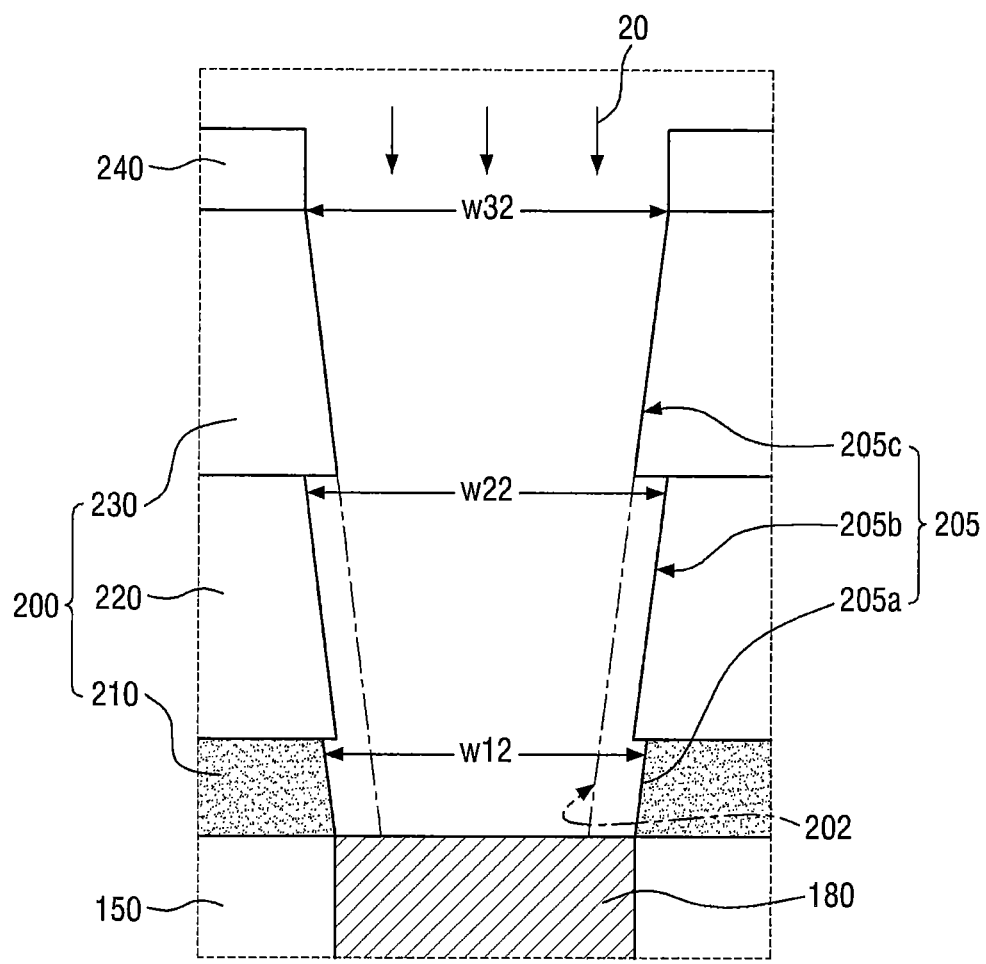

Referring to FIGS. 5A to 5C, a second trench 205 may be formed in the first mold structure 200 using a wet etching 20. The wet etching 20 may be performed using, for example, an etchant prepared by mixing deionized (DI) water with hydrofluoric acid (HF).

The second trench 205 may include a first portion 205a of the second trench 205, a second portion 205b of the second trench 205 and a third portion 205c of the second trench 205.

The first portion 205a of the second trench 205 may be formed in the first etch stop layer 210, the second portion 205b of the second trench 205 may be formed in the first lower mold layer 220, and the third portion 205c of the second trench 205 may be formed in the first upper mold layer 230.

In detail, the first portion 205a of the second trench 205 may be formed by extending a width of the first portion 202a of the first trench 202 in the first etch stop layer 210 using the wet etching 20. The second portion 205b of the second trench 205 may be formed by extending a width of the second portion 202b of the first trench 202 in the first lower mold layer 220 using the wet etching 20.

However, the third portion 205c of the second trench 205 formed in the first upper mold layer 230 may be substantially similar to the third portion 202c of the first trench 202. In other words, the first upper mold layer 230 included in the first mold structure 200 may not be etched by the wet etching 20, but aspects of the present disclosure are not limited thereto.

Therefore, the first etch stop layer 210 and the first lower mold layer 220 may be selectively etched by the wet etching 20.

In FIGS. 4B to 5C, as the result of the wet etching 20, the width w11 of the first portion 202a of the first trench 202 may be extended to a width w12 of the first portion 205a of the second trench 205 and the width w21 of the second portion 202b of the first trench 202 may be extended to a width w22 of the second portion 205b of the second trench 205. However, even after the wet etching 20, a width w31 of the third portion 202c of the first trench 202 may be substantially equal to a width w32 of the third portion 205c of the second trench 205.

Hereinafter, a change in the width w12 of the first portion 205a of the second trench 205 depending on the concentration of boron (B) doped into the first etch stop layer 210 will be described with reference to FIGS. 3 and 5A to 5C.

In the methods of fabricating semiconductor devices according to some embodiments of the present inventive concept, the concentration of boron (B) doped into the first lower mold layer 220 may be held constant while the concentration of boron (B) doped into the first etch stop layer 210 may vary. Therefore, the width of the second portion 205b of the second trench 205 extended by the wet etching 20 may be determined once an integration level of a semiconductor device is determined.

FIG. 5A illustrates process operations when the concentration of boron (B) doped into the etch stop layer 210 is a %, FIG. 5B illustrates process operations when the concentration of boron (B) doped into the etch stop layer 210 is b %, b % being greater than a %. FIG. 5C illustrates process operations when the concentration of boron (B) doped into the first etch stop layer 210 is c %, c % being greater than b %.

As shown in FIGS. 5A to 5C, as the concentration of boron (B) doped into the first etch stop layer 210 increases, sidewalls of the first portion 205a of the second trench 205 may be more distant from sidewalls of the first trench 202 in the first etch stop layer 210.

In other words, as the concentration of boron (B) doped into the first etch stop layer 210 increases, the width w12 of the first portion 205a of the second trench 205 increases.

In addition, as shown in FIG. 5A, as the result of the wet etching 20, when the concentration of boron (B) doped into the etch stop layer 210 is a %, the width of the second portion 205b of the second trench 205 may be further extended than that of the first portion 205a of the second trench 205. As shown in FIG. 5B, as the result of the wet etching 20, when the concentration of boron (B) doped into the etch stop layer 210 is b %, the width of the second portion 205b of the second trench 205 may be extended to be substantially similar to that of the first portion 205a of the second trench 205. By contrast, as shown in FIG. 5C, as the result of the wet etching 20, when the concentration of boron (B) doped into the etch stop layer 210 is c %, the width of the first portion 205a of the second trench 205 may be further extended than that of the second portion 205b of the second trench 205.

In other words, as the concentration of boron (B) doped into the first etch stop layer 210 varies, a ratio of the width w12 of the first portion 205a of the second trench 205 to the width w22 of the second portion 205b of the second trench 205 varies. In more detail, as the concentration of boron (B) doped into the first etch stop layer 210 increases, the ratio of the width w12 of the first portion 205a of the second trench 205 to the width w22 of the second portion 205b of the second trench 205 may also increase.

An etched amount of the first etch stop layer 210 may be increased by the wet etching 20 when the concentration of boron (B) doped into the first etch stop layer 210 increases.

Figure 6A:
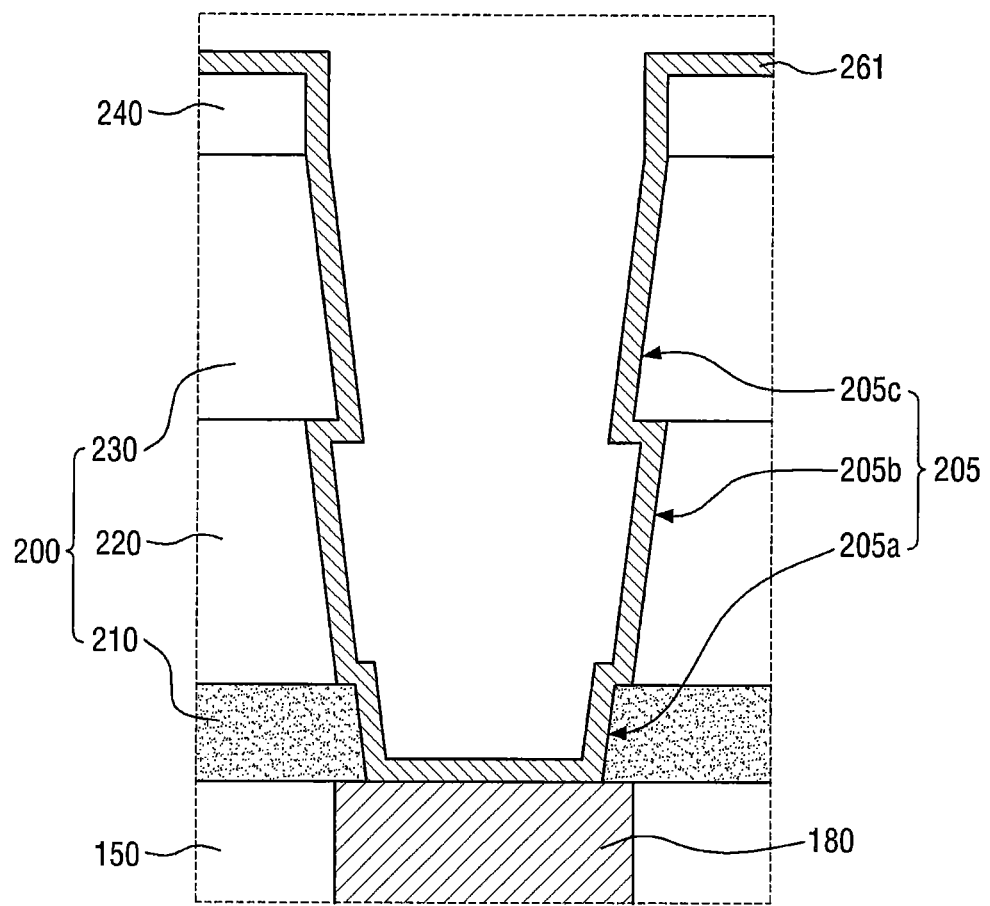
Figure 6B:
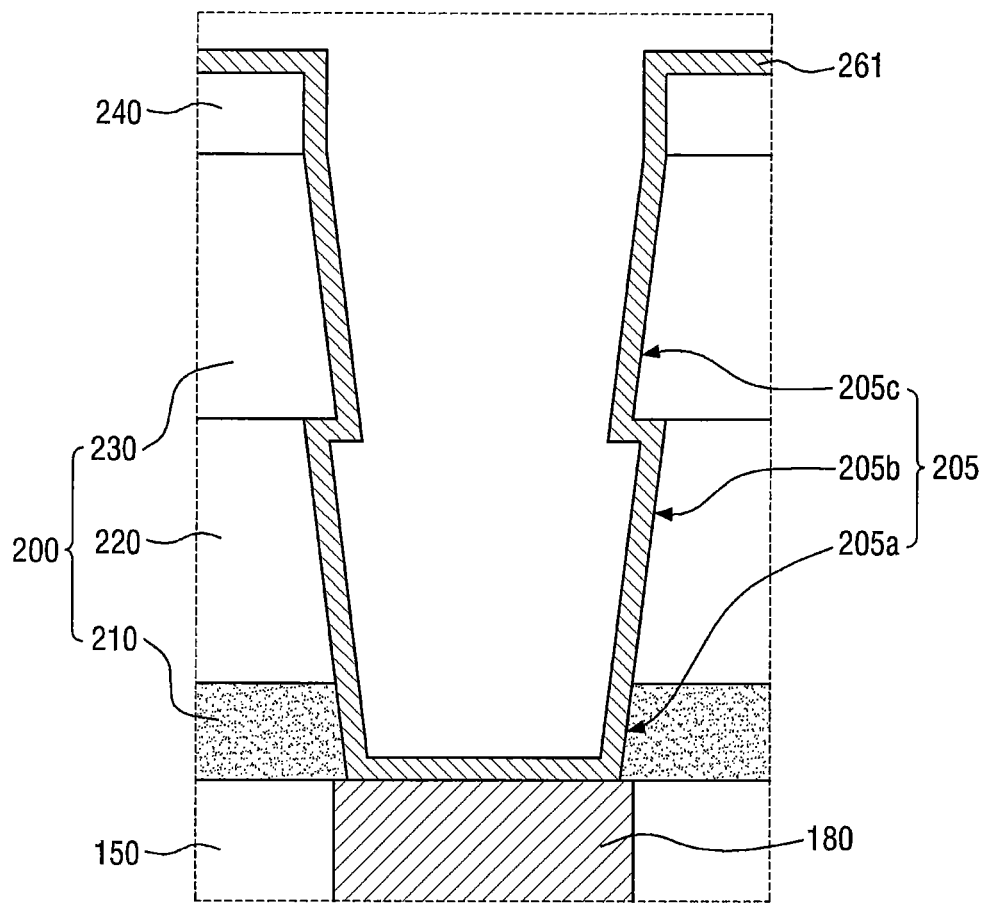
Figure 6C:
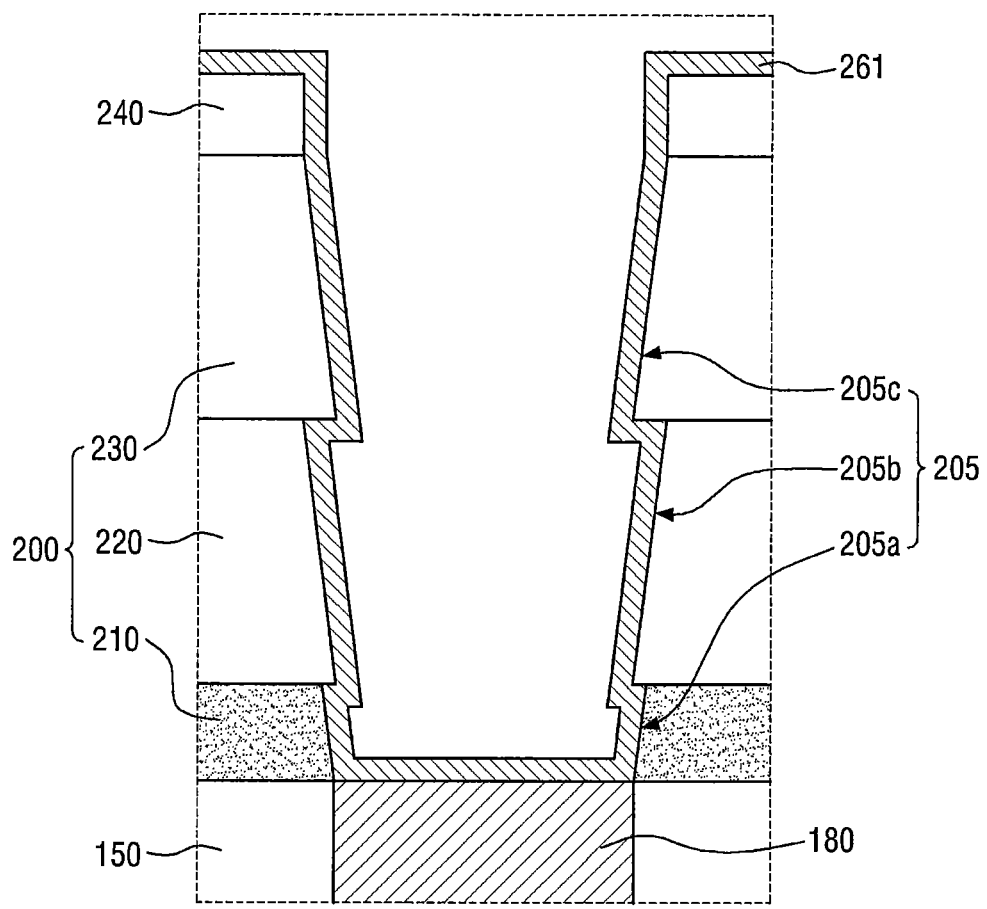

Referring to FIGS. 6A to 6C, a lower electrode layer 261 may be conformally formed along sidewalls and a bottom surface of the second trench 205 and a top surface of the first mold structure 200. The lower electrode layer 261 may be formed on a top surface of the first mask pattern 240.

In detail, the lower electrode layer 261 formed along the sidewalls and the bottom surface of the second trench 205 may be formed along sidewalls of the third portion 205c of the second trench 205, sidewalls of the second portion 205b of the second trench 205 and sidewalls and a bottom surface of the first portion 205a of the second trench 205.

The lower electrode layer 261 may include a conductive material, for example, at least one of doped polysilicon, conductive metal nitride (e.g., titanium nitride, tantalum nitride, tungsten nitride, etc.), a metal (e.g., ruthenium, iridium, titanium, tantalum, etc.), and conductive metal oxide (e.g., iridium oxide, etc.).

The lower electrode layer 261 may be formed using, for example, CVD and/or ALD, but aspects of the present disclosure are not limited thereto.

Figure 7A:
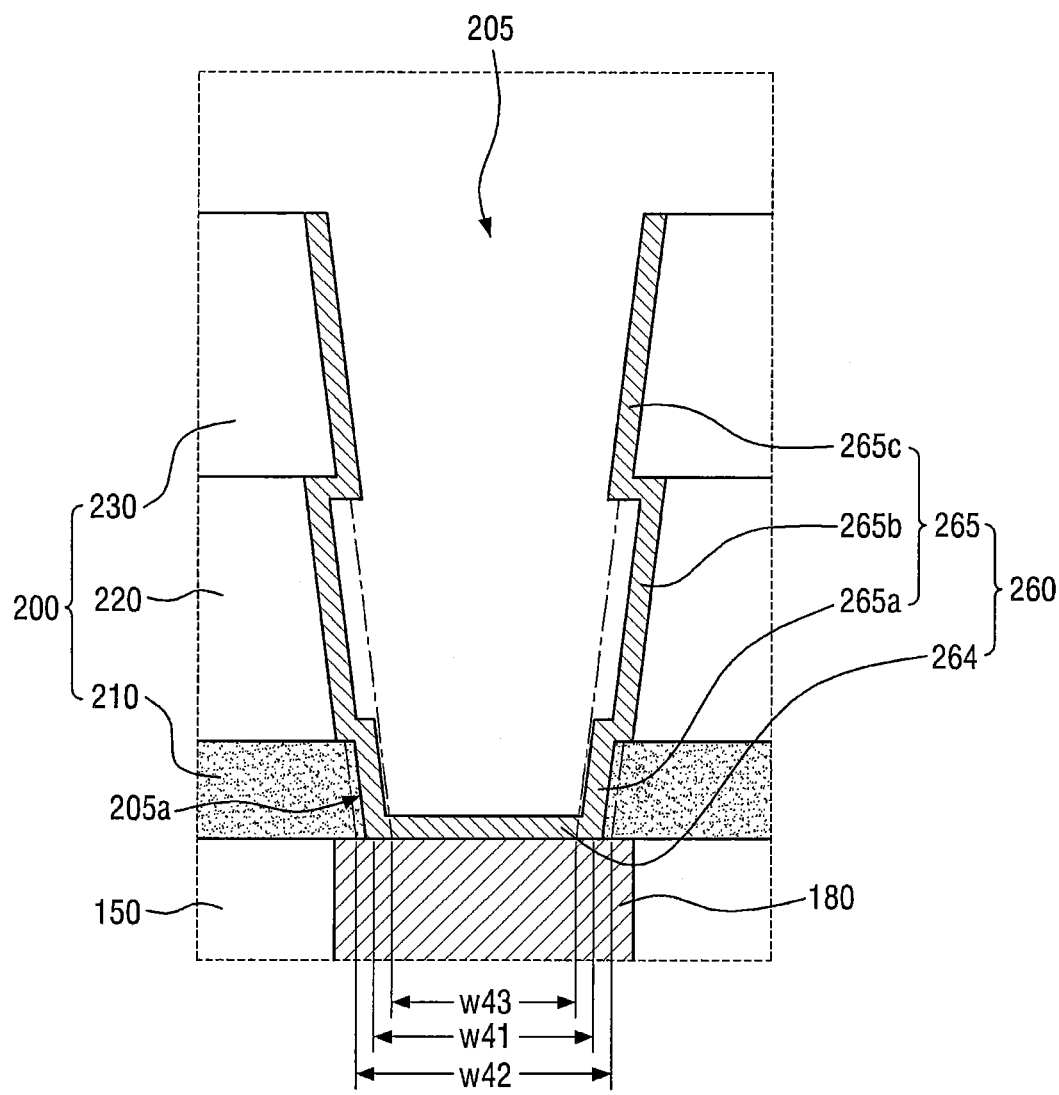
Figure 7B:
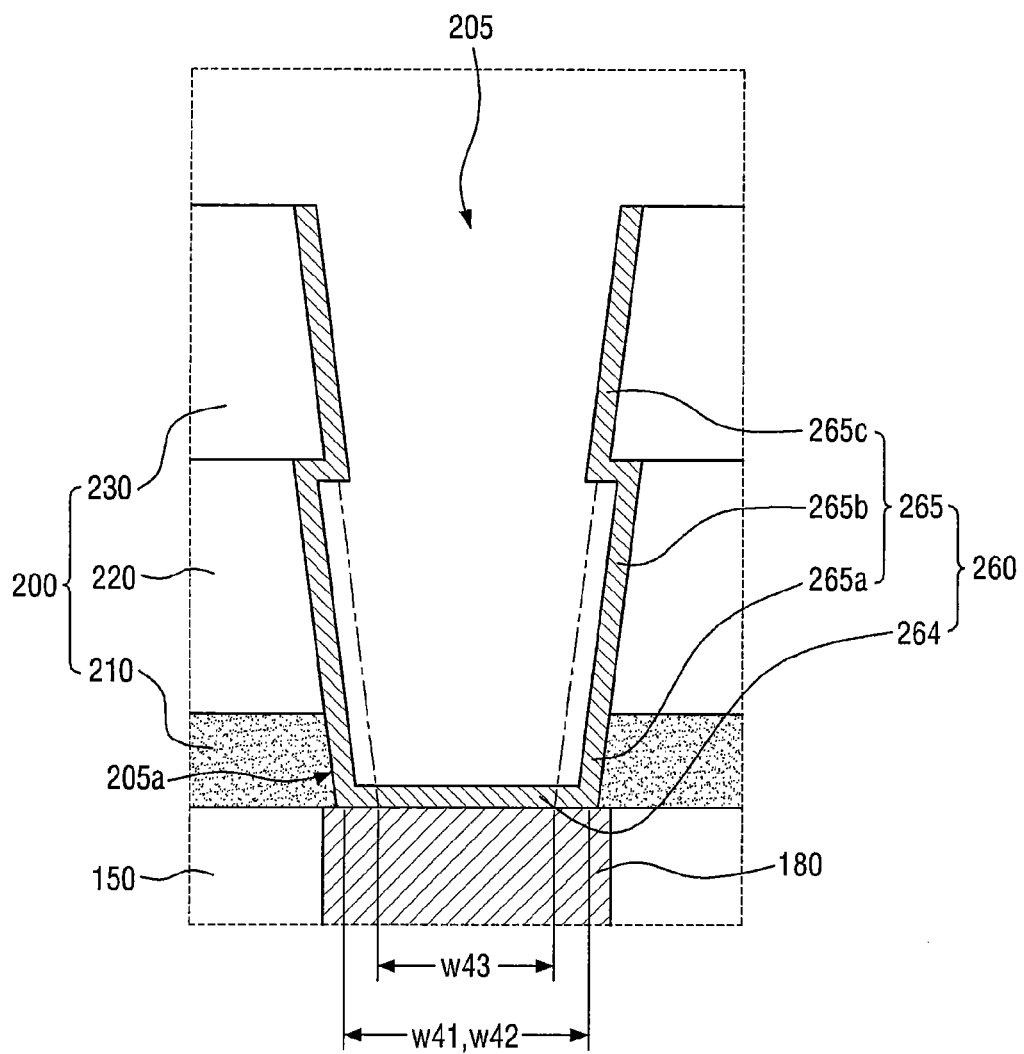
Figure 7C:
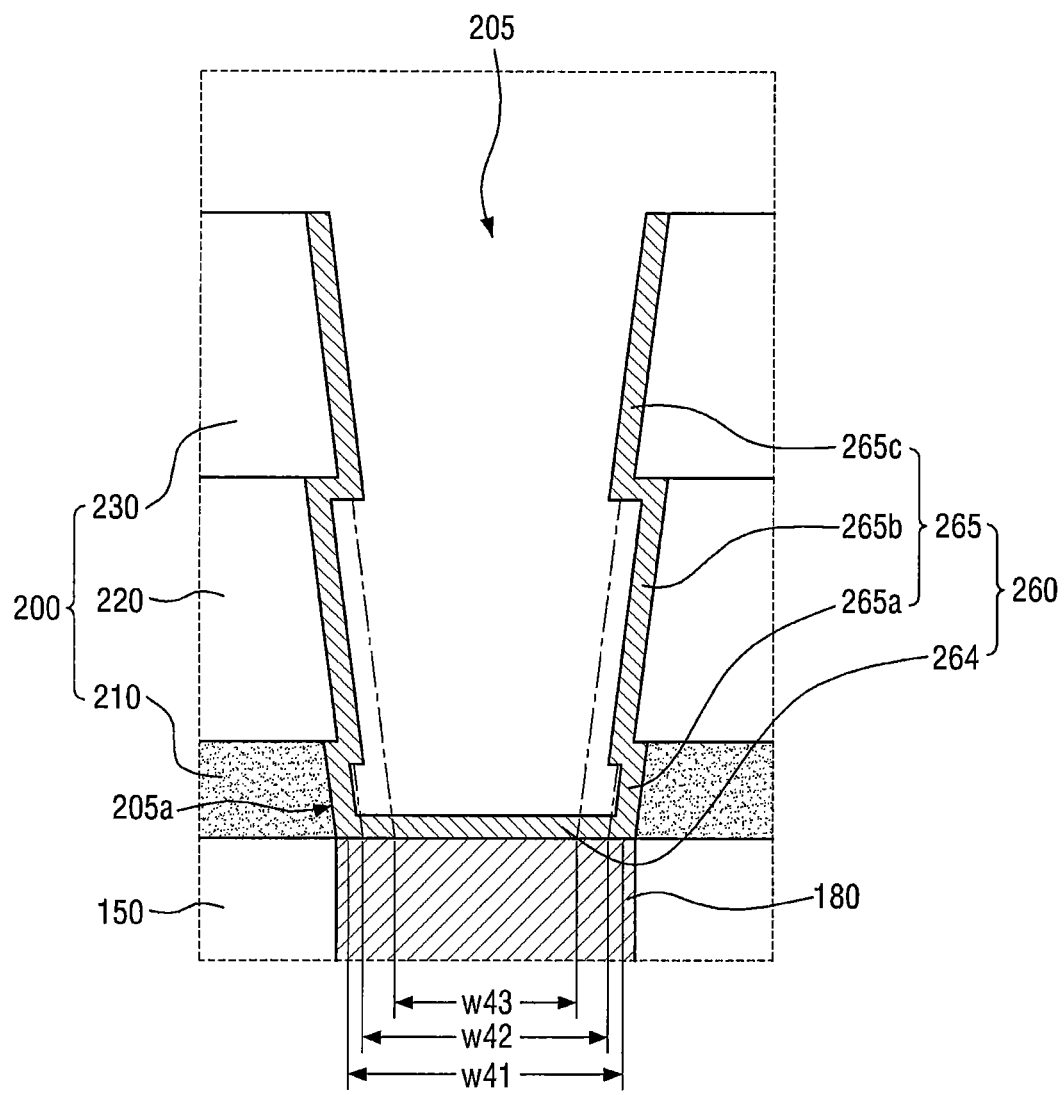

Referring to FIGS. 7A to 7C, a lower electrode 260 may be formed in the second trench 205. The lower electrode 260 may be formed along the sidewalls and the bottom surface of the second trench 205. The lower electrode 260 may include a bottom portion 264 formed on the second contact plug 180 and protruding portions 265 extending to face each other along the sidewalls of the second trench 205.

In detail, a sacrificial layer may be formed on the lower electrode layer 261 while filling the second trench 205. The sacrificial layer may include a good gap-filling capability.

The first mask pattern 240 formed on the first mold structure 200, the lower electrode layer 261 formed on the top surface of the first mold structure 200, and a portion of the sacrificial layer formed on the lower electrode layer 261 may be removed using at least one of chemical mechanical polishing (CMP) and etch back until the first upper mold layer 230 may be exposed.

As a result, the lower electrode 260 electrically connected to the second contact plug 180 may be formed in the second trench 205 to then be electrically disconnected.

The sacrificial layer remaining in the second trench 205 having the lower electrode 260 may be removed.

Figure 8A:
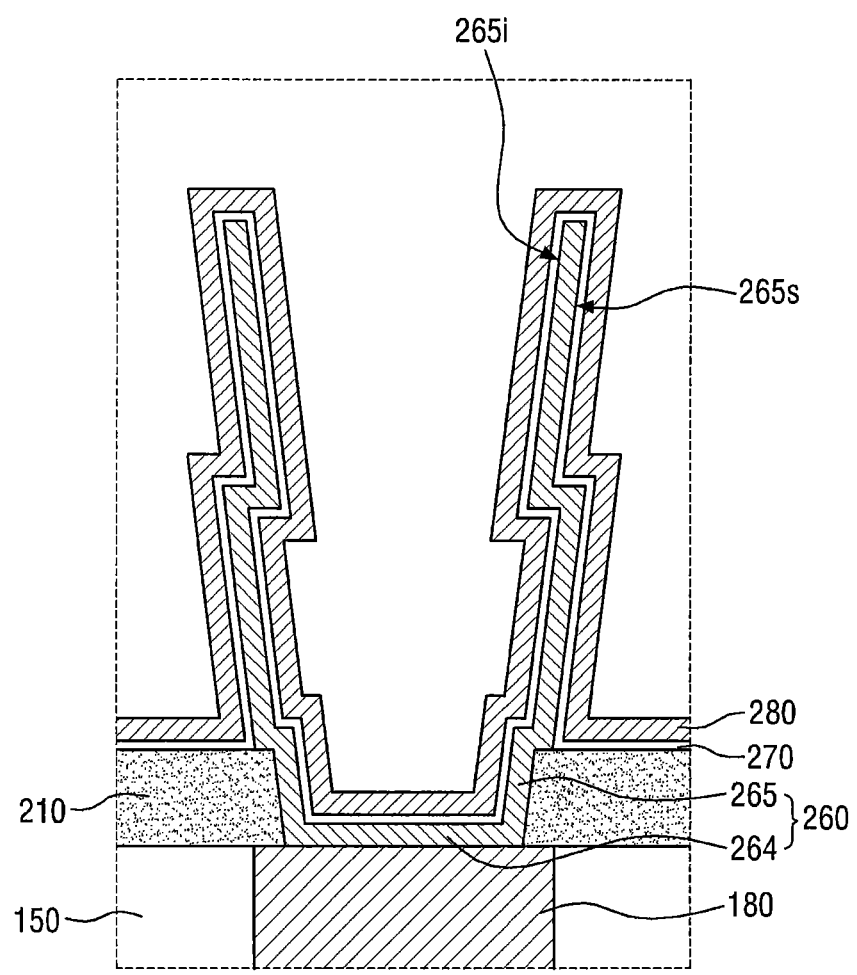
Figure 8B:
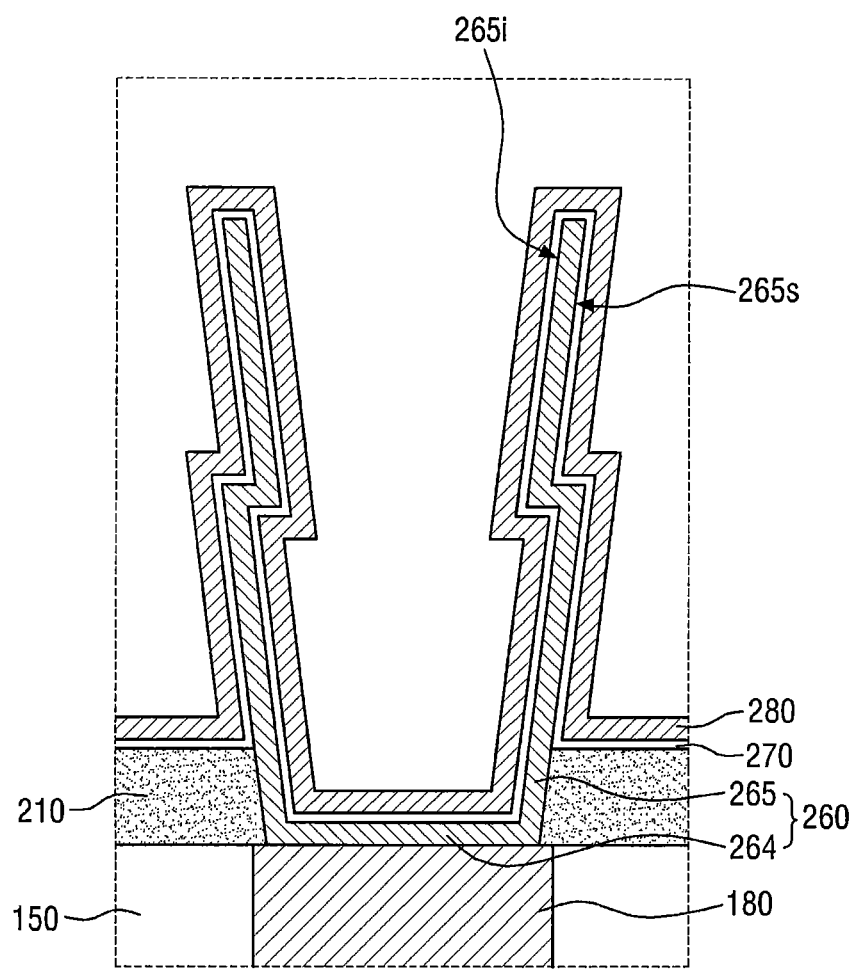
Figure 8C:
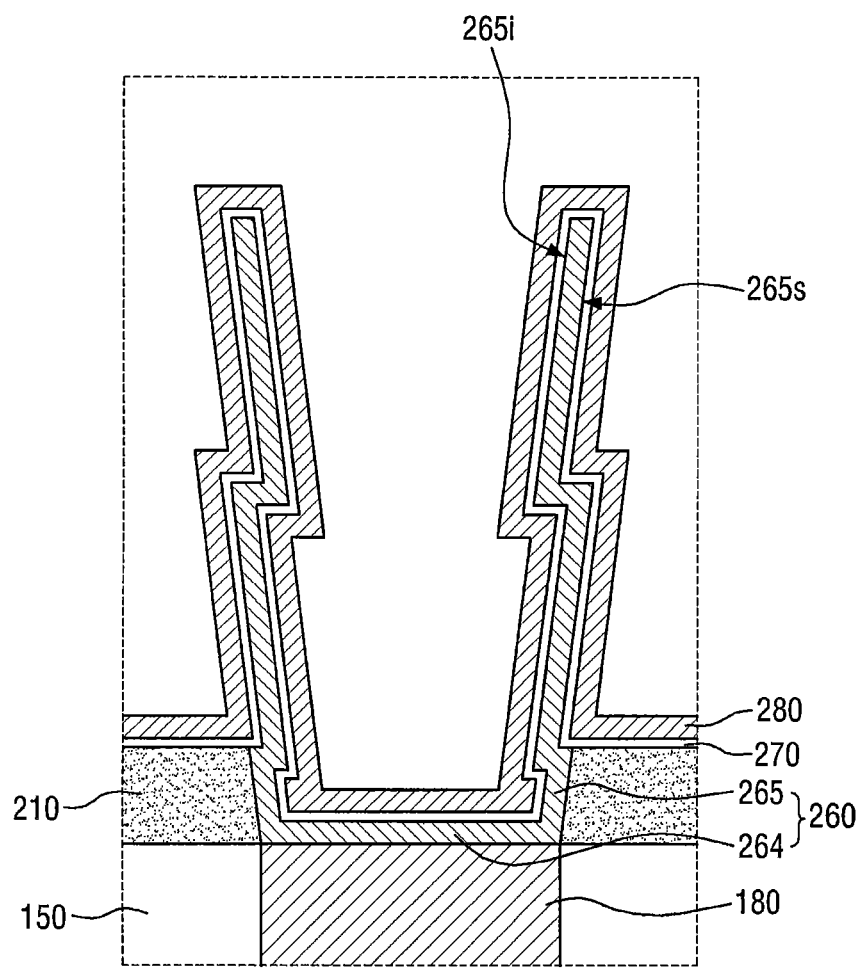

Referring to FIGS. 8A to 8C, a capacitor dielectric layer 270 and an upper electrode 280 may be sequentially formed on the lower electrode 260.

In detail, the first upper mold layer 230 and the first lower mold layer 220 being in contact with outer sidewalls 265s of the lower electrode 260 may be removed to expose the top surface of the first etch stop layer 210. At this stage, the outer sidewalls 265s of the lower electrode 260 may also be exposed.

The capacitor dielectric layer 270 may be conformally formed on the lower electrode 260. In other words, the capacitor dielectric layer 270 may be conformally formed along the outer sidewalls 265s of the lower electrode 260, inner sidewalls 265i of the lower electrode 260, the bottom surface of the lower electrode 260, and the top surface of the first etch stop layer 210.

The capacitor dielectric layer 270 may include, for example, at least one of silicon oxide, silicon nitride, silicon oxynitride, and a high-k material. The high-k material may include, for example, one or more selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but not limited thereto.

The capacitor dielectric layer 270 may be formed by, for example, ALD, but not limited thereto.

The upper electrode 280 may be formed on the capacitor dielectric layer 270. In FIGS. 8A to 8C, the upper electrode 280 conformally formed along the capacitor dielectric layer 270 is illustrated, which is, however, provided only for the sake of convenient explanation, but aspects of the present disclosure are not limited thereto.

The upper electrode 280 may include, for example, at least one of doped polysilicon, conductive metal nitride (e.g., titanium nitride, tantalum nitride, tungsten nitride, etc.), a metal (e.g., ruthenium, iridium, titanium, tantalum, etc.), and conductive metal oxide (e.g., iridium oxide, etc.).

The upper electrode 280 may be formed by, for example, CVD and/or ALD, but aspects of the present disclosure are not limited thereto.

A semiconductor device according to some embodiments of the present inventive concept will be described with reference to FIGS. 2, 7C and 8C.

Referring to FIGS. 2, 7C and 8C, the semiconductor device according to some embodiments of the present inventive concept may include the lower electrode 260, the capacitor dielectric layer 270 and the upper electrode 280.

The interlayer insulation layer 150 may be formed on the substrate 100. The interlayer insulation layer 150 may include the second contact plug 180 electrically connected to the second impurity region 107b.

The lower electrode 260 may be formed on the interlayer insulation layer 150 including the second contact plug 180. The lower electrode 260 may be electrically connected to the second contact plug 180.

The lower electrode 260 may include the bottom portion 264 and the protruding portions 265. The bottom portion 264 of the lower electrode 260 may be formed on the exposed second contact plug 180.

The protruding portions 265 of the lower electrode 260 may protrude from the interlayer insulation layer 150 and extend to face each other in one direction. The protruding portions 265 of the lower electrode 260 may include a first part 265a, a second part 265b and a third part 265c. The first part 265a of each of the protruding portions 265 of the lower electrode 260 may be connected to the bottom portion 264 of the lower electrode 260 and may be formed on sidewalls of the first portion 205a of the second trench 205. The second part 265b and the third part 265c of each of the protruding portions 265 of the lower electrode 260 may be sequentially disposed on the first part 265a of each of the protruding portions 265 of the lower electrode 260. The second part 265b of each of the protruding portions 265 of the lower electrode 260 may be a part formed on sidewalls of the second portion 205b of the second trench 205 and the third part 265c of each of the protruding portions 265 of the lower electrode 260 may be a part formed on the sidewalls of the third portion 205c of the second trench 205.

In addition, on the top surface of the interlayer insulation layer 150, a width between lines extending from the first part 265a of the protruding portions 265 of the lower electrode 260 to the top surface of the interlayer insulation layer 150 may be denoted by a width w41. On the top surface of the interlayer insulation layer 150, a width between lines extending from the second part 265b of the protruding portions 265 of the lower electrode 260 to the top surface of the interlayer insulation layer 150 may be denoted by a width w42. On the top surface of the interlayer insulation layer 150, a width between lines extending from the third part 265c of the protruding portions 265 of the lower electrode 260 to the top surface of the interlayer insulation layer 150 may be denoted by a width w43.

In the semiconductor device according to some embodiments of the present inventive concept, the width w42 on the top surface of the interlayer insulation layer 150 between the lines extending from the second part 265b of the protruding portions 265 of the lower electrode 260 may be smaller than the width w41 on the top surface of the interlayer insulation layer 150 between the lines extending from the first part 265a of the protruding portions 265 of the lower electrode 260 and may be greater than the width w43 on the top surface of the interlayer insulation layer 150 between the lines extending from of the third part 265c of the protruding portions 265 of the lower electrode 260.

The capacitor dielectric layer 270 may be conformally formed along the top surface of the bottom portion 264 of the lower electrode 260, the inner sidewalls 265i of the protruding portions 265 of the lower electrode 260 and the outer sidewalls 265s of the protruding portions 265 of the lower electrode 260. The capacitor dielectric layer 270 may also be conformally formed along the top surface of the first etch stop layer 210.

The upper electrode 280 may be formed on the capacitor dielectric layer 270. The upper electrode 280 may be formed along the capacitor dielectric layer 270.

Methods for fabricating semiconductor devices according to some embodiments of the present inventive concept will be described with reference to FIGS. 1 to 5C and 9A to 12C.

FIGS. 9A to 12C are cross-sectional views illustrating intermediate process operations in methods for fabricating semiconductor devices according to some embodiments of the present inventive concept.

FIGS. 9A to 12C illustrate process operations performed after the process operations shown in FIG. 4B. FIGS. 9A, 10A, 11A and 12A illustrate process operations when the concentration of boron (B) doped into an etch stop layer is a %, as shown in FIG. 3. FIGS. 9B, 10B, 11B and 12B illustrate process operations when the concentration of boron (B) doped into an etch stop layer is b %, as shown in FIG. 3, b % being greater than a %. FIGS. 9C, 10C, 11C and 12C illustrate process steps when the concentration of boron (B) doped into an etch stop layer is c %, as shown in FIG. 3, c % being greater than b %.

Figure 9A:
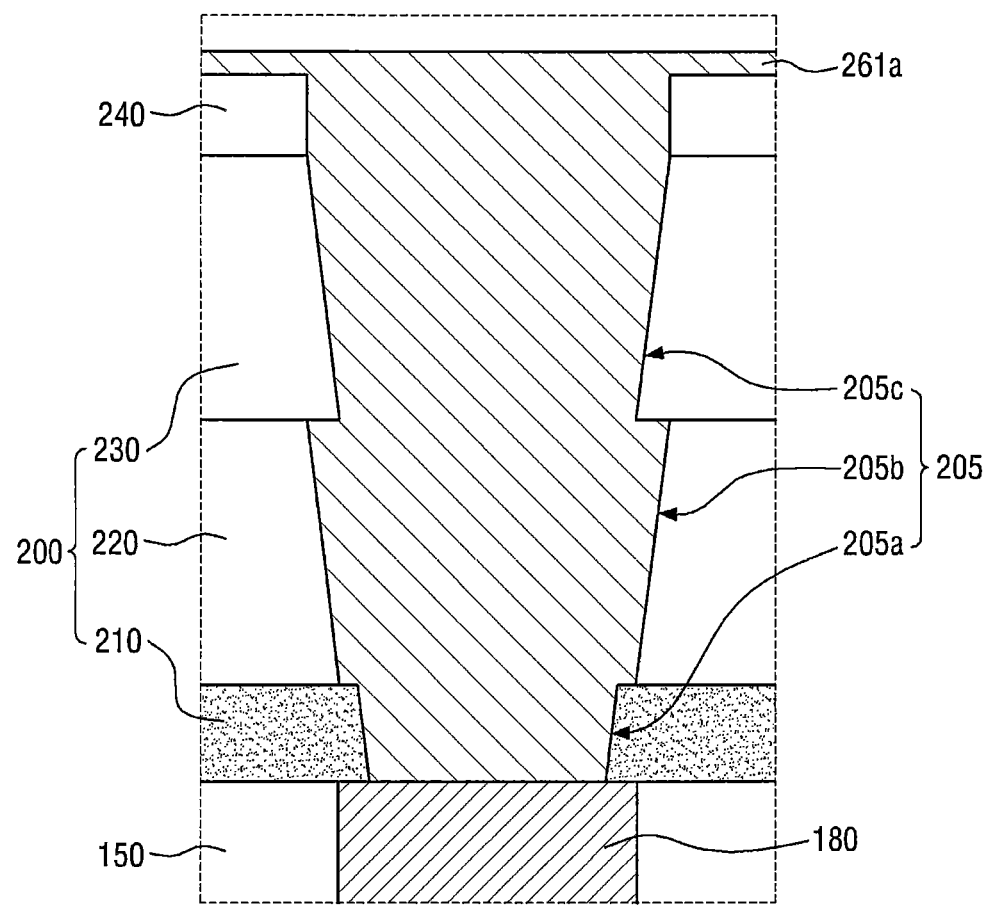
FIGS. 9A-9C, 10A-10C, 11A-11C, and 12A-12C are cross-sectional views illustrating intermediate process operations in methods for fabricating semiconductor devices according to some embodiments of the present inventive concept.
Figure 9B:
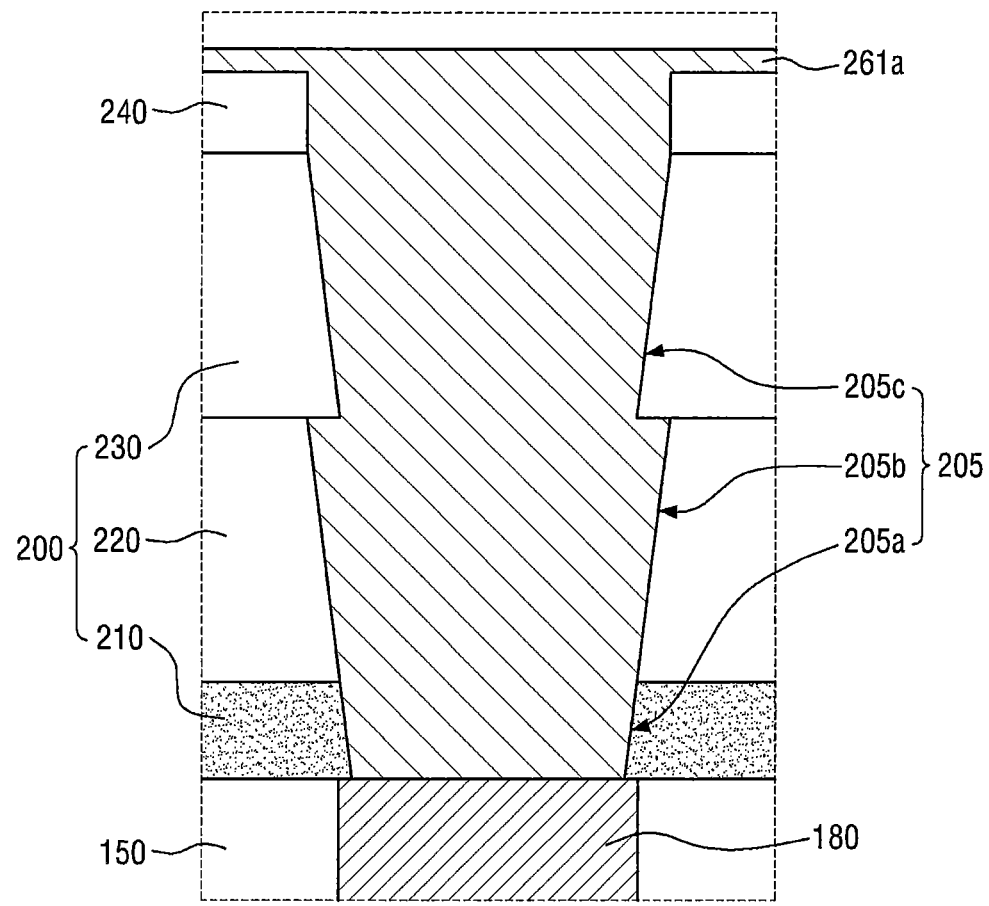
Figure 9C:
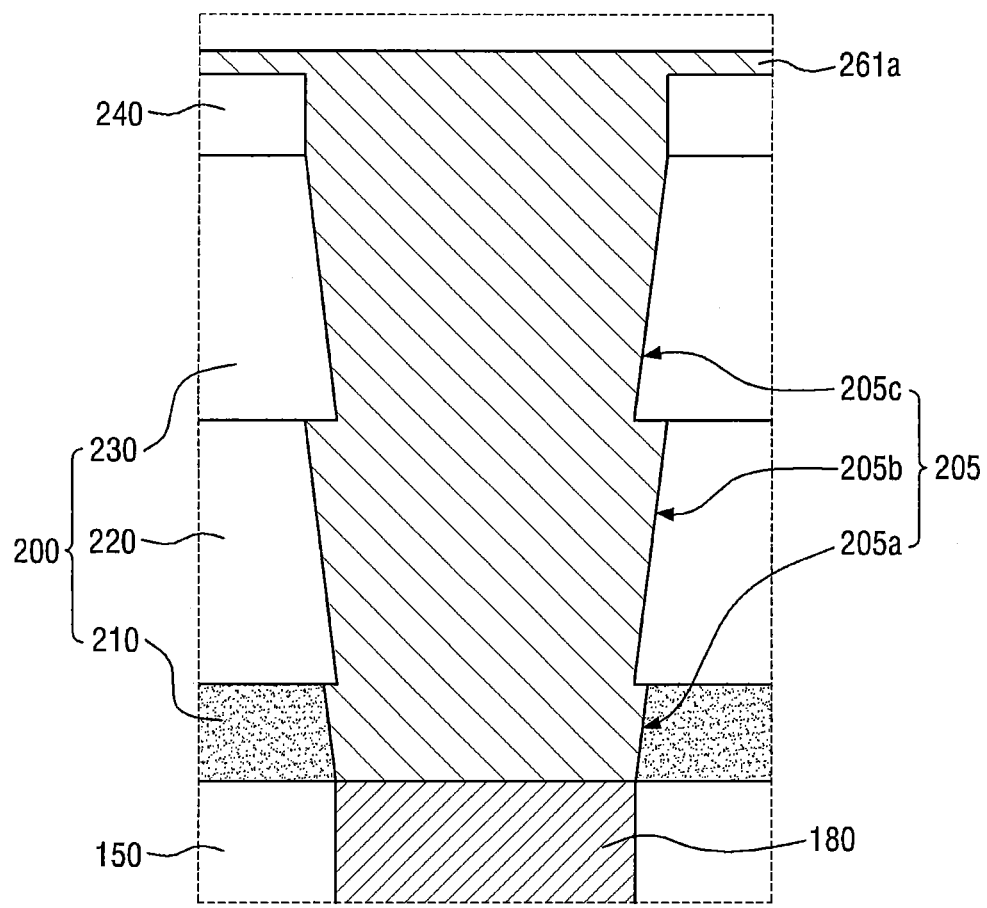

Referring to FIGS. 9A to 9C, a lower electrode layer 261a filling the second trench 205 may be formed on the second trench 205. The lower electrode layer 261a may also be formed on the top surface of the first mold structure 200 while filling the second trench 205.

In detail, the lower electrode layer 261a may fill the first portion 205a of the second trench 205, the second portion 205b of the second trench 205, and the third portion 205c of the second trench 205. In addition, the lower electrode layer 261a may also be formed on the top surface of the first mold structure 200, that is, the top surface of the first mask pattern 240.

Figure 10A:
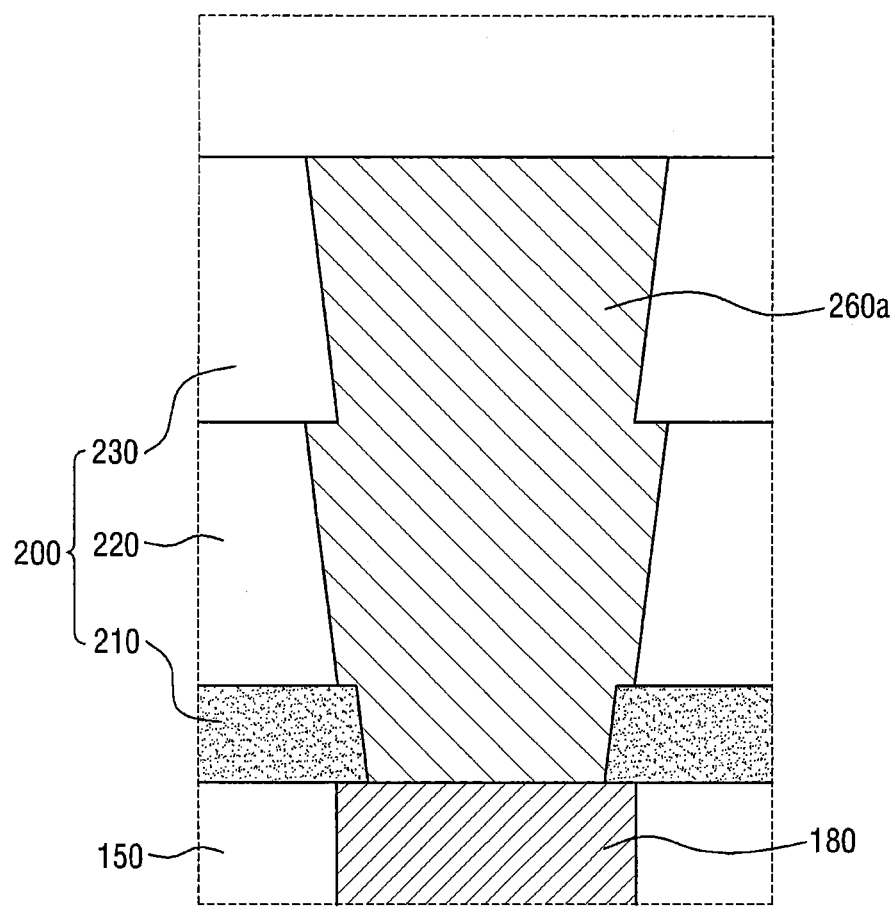
Figure 10B:
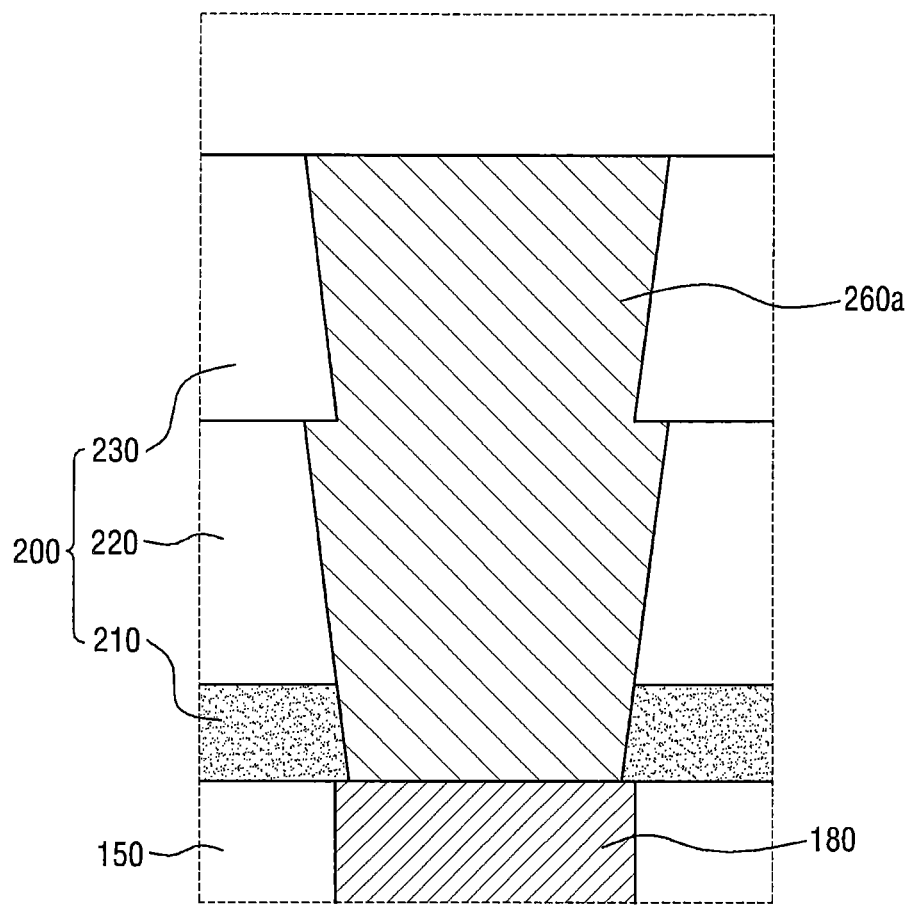
Figure 10C:
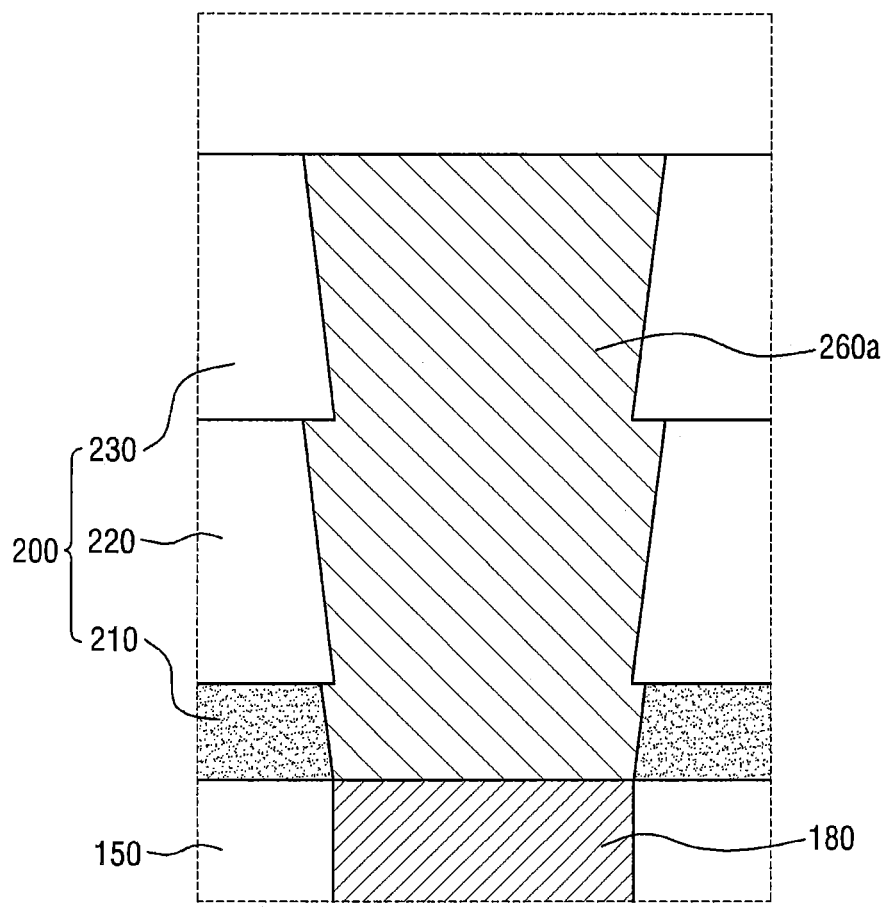

Referring to FIGS. 10A to 10B, a lower electrode 260a may be formed in the second trench 205. The lower electrode 260a may entirely fill the second trench 205 formed in the first mold structure 200.

In detail, the lower electrode layer 261a formed on the top surface of the first mold structure 200 may be removed using CMP. The first mask pattern 240 positioned on the first mold structure 200 may also be removed.

Figure 11A:
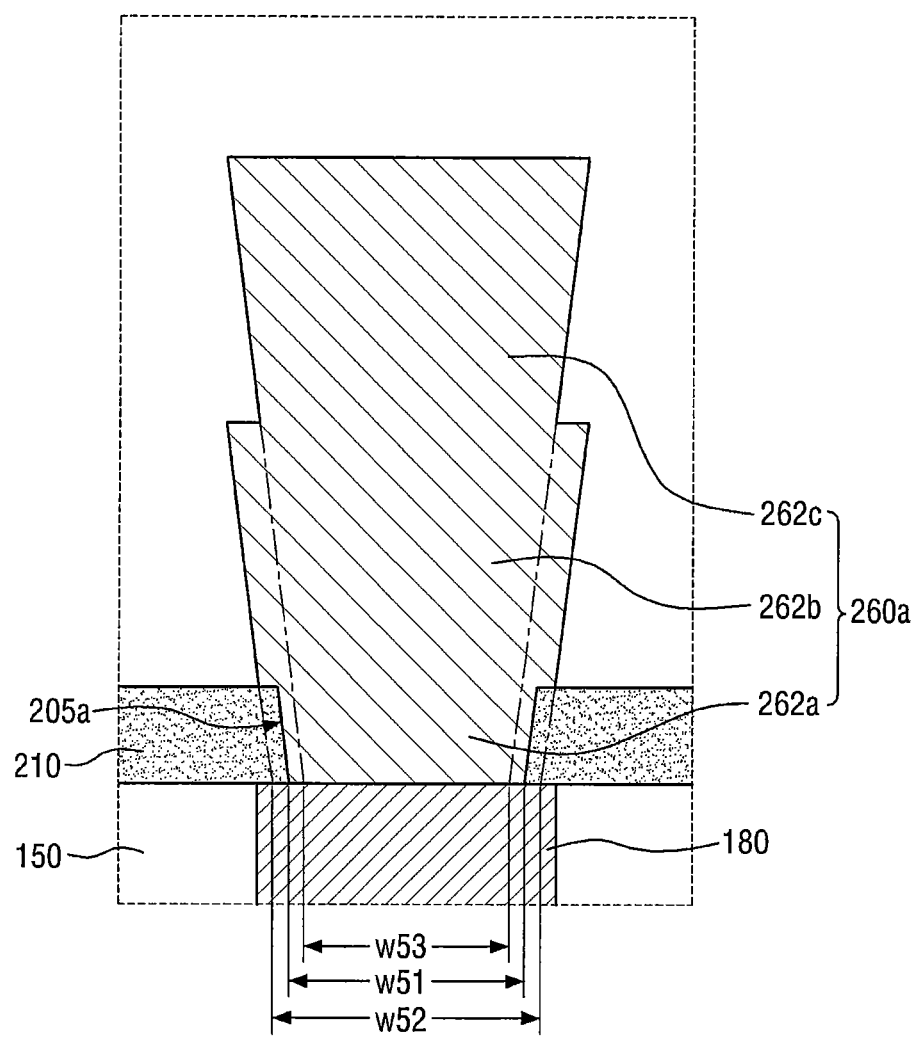
Figure 11B:
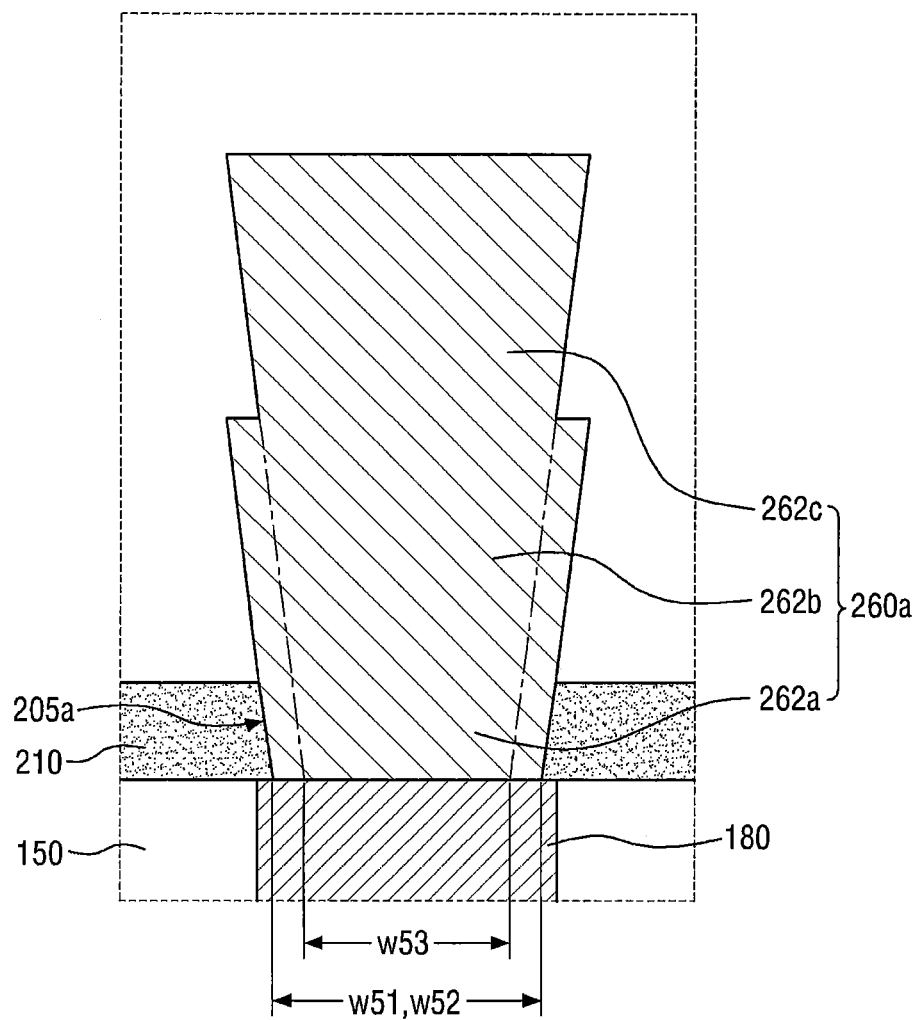
Figure 11C:
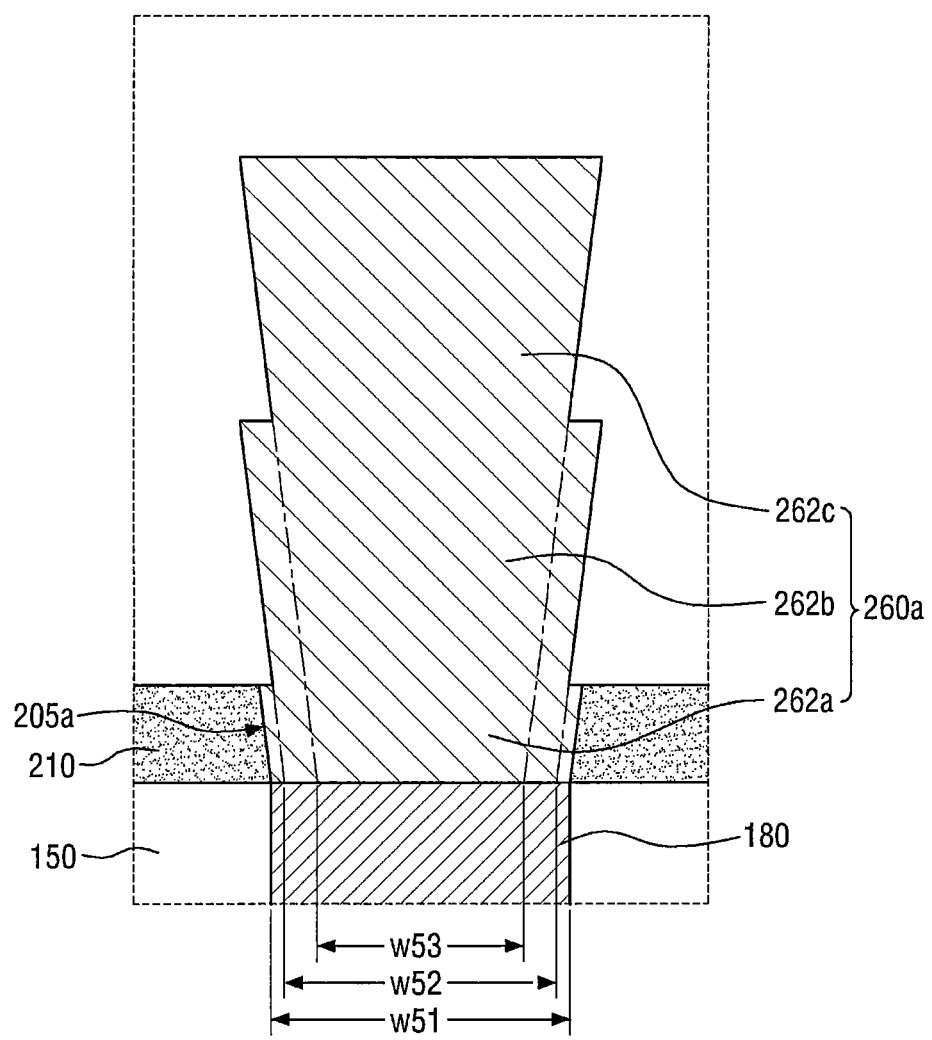

Referring to FIGS. 11A to 11C, the first upper mold layer 230 and the first lower mold layer 220 being in contact with the lower electrode 260a upwardly protruding from the top surface of the first etch stop layer 210 may be removed.

As a result, an outer circumferential surface of the lower electrode 260a may be exposed and the top surface of the first etch stop layer 210 may also be exposed.

Figure 12A:
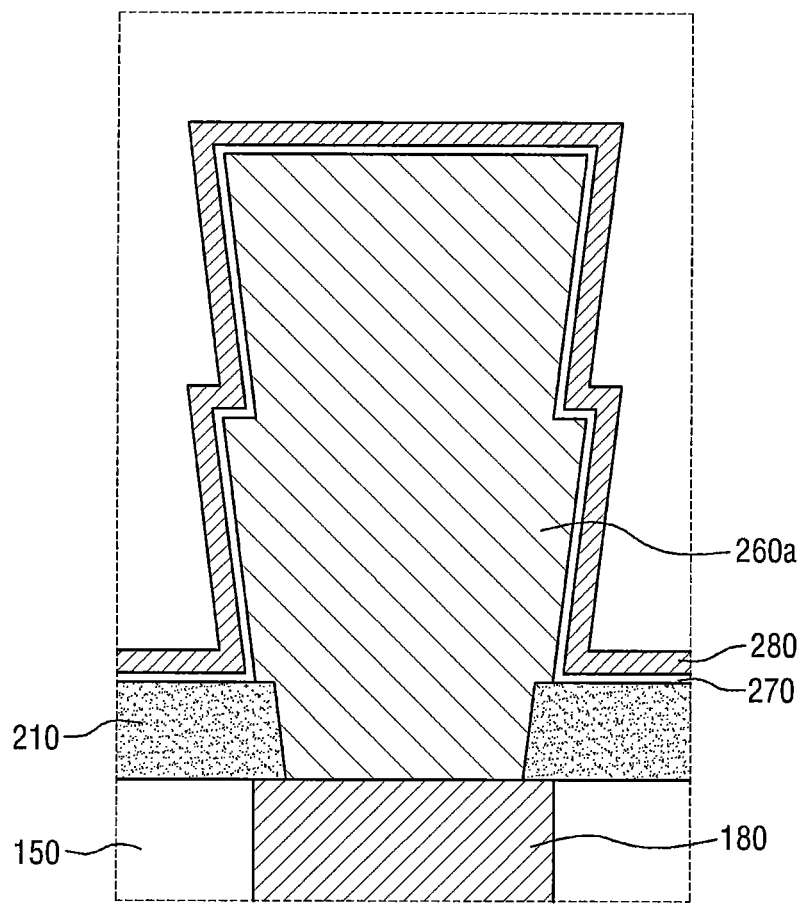
Figure 12B:
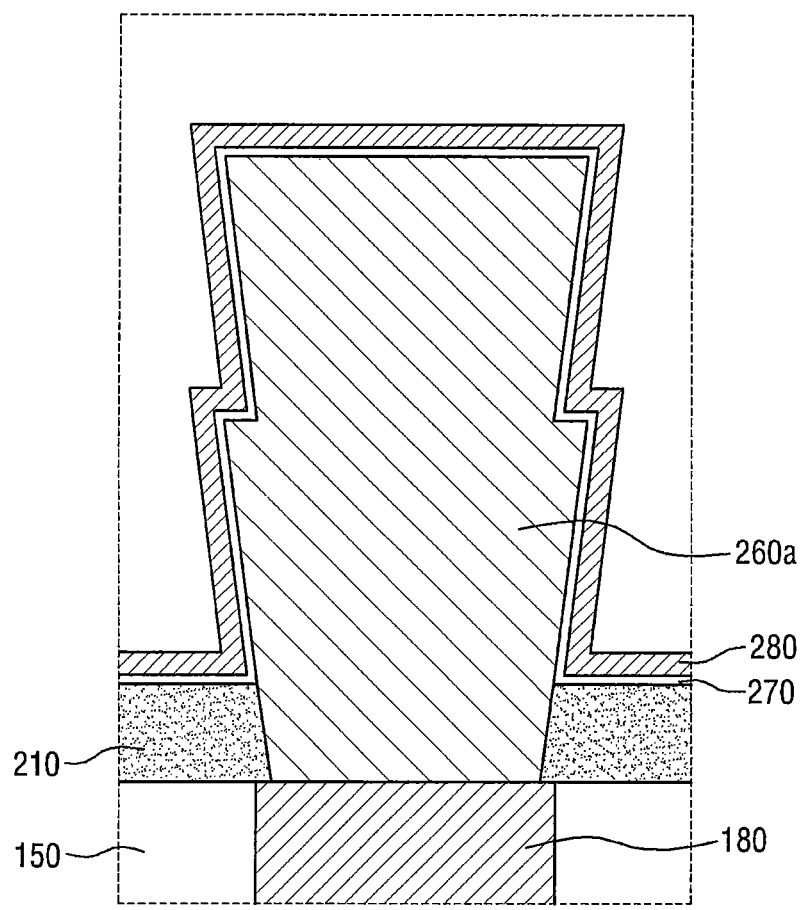
Figure 12C:
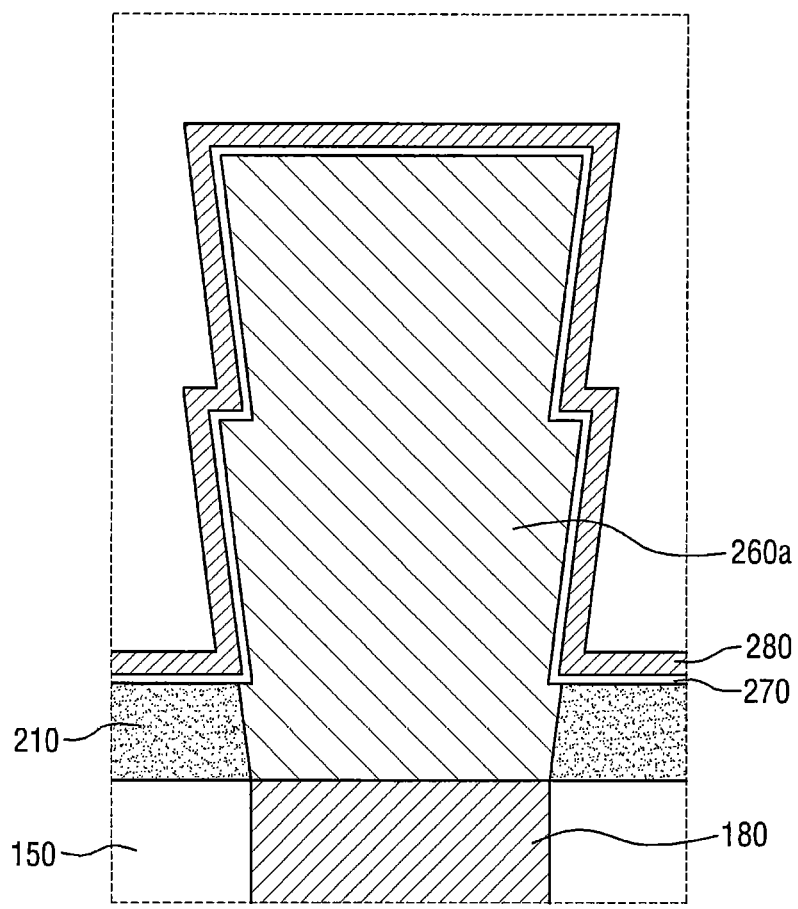

Referring to FIGS. 12A to 12C, a capacitor dielectric layer 270 and an upper electrode 280 may be sequentially formed on the lower electrode 260a.

The capacitor dielectric layer 270 may be conformally formed along the outer circumferential surface of the lower electrode 260a upwardly protruding from the top surface of the first etch stop layer 210. The capacitor dielectric layer 270 may also be conformally formed on the top surface of the first etch stop layer 210.

The upper electrode 280 may be formed on the capacitor dielectric layer 270. In FIGS. 12A to 12C, the upper electrode 280 conformally formed along the capacitor dielectric layer 270 is illustrated, which is, however, provided only for the sake of convenient explanation, but aspects of the present disclosure are not limited thereto.

A semiconductor device according to some embodiments of the present inventive concept will be described with reference to FIGS. 2, 11C and 12C.

Referring to FIGS. 2 and 11C and 12C, the semiconductor device according to some embodiments of the present inventive concept may include the lower electrode 260a, the capacitor dielectric layer 270 and the upper electrode 280.

The lower electrode 260a formed on the interlayer insulation layer 150 may be electrically connected to the second contact plug 180. The lower electrode 260a may include a first part 262a, a second part 262b and a third part 262c.

The first part 262a of the lower electrode 260a may be a part connected to the second contact plug 180. The first part 262a of the lower electrode 260a may be formed in the first portion 205a of the second trench 205 formed in the first etch stop layer 210. The second part 262b and the third part 262c of the lower electrode 260a may be sequentially disposed on the first part 262a of the lower electrode 260a.

On the top surface of the interlayer insulation layer 150, a width between lines extending from opposing outer surfaces of the first part 262a of the lower electrode 260a to the top surface of the interlayer insulation layer 150 may be denoted by a width w51. On the top surface of the interlayer insulation layer 150, a width between lines extending from opposing outer surfaces of the second part 262b of the lower electrode 260a to the top surface of the interlayer insulation layer 150 may be denoted by a width w52. On the top surface of the interlayer insulation layer 150, a width between lines extending from opposing outer surfaces of the third part 262c of the lower electrode 260a to the top surface of the interlayer insulation layer 150 may be denoted by a width w53.

In the semiconductor device according to some embodiments of the present inventive concept, the width w52 between the lines extending from the opposing outer surfaces of the second part 262b of the lower electrode 260a may be smaller than the width w51 between the lines extending from the opposing outer surfaces of the first part 262a of the lower electrode 260a and may be greater than the width w53 between the lines extending from the opposing outer surfaces of the third part 262c of the lower electrode 260a.

The capacitor dielectric layer 270 may be conformally formed along an outer circumferential surface of the lower electrode 260a and a top surface of the first etch stop layer 210.

The upper electrode 280 may be formed on the capacitor dielectric layer 270. In other words, the upper electrode 280 may be formed along the outer circumferential surface of the lower electrode 260a and the top surface of the first etch stop layer 210.

Methods for fabricating semiconductor devices according to some embodiments of the present inventive concept will be described with reference to FIGS. 13 to 16.

FIGS. 13 to 16 are cross-sectional views illustrating intermediate process operations in methods for fabricating semiconductor devices according to some embodiments of the present inventive concept.

Figure 13:
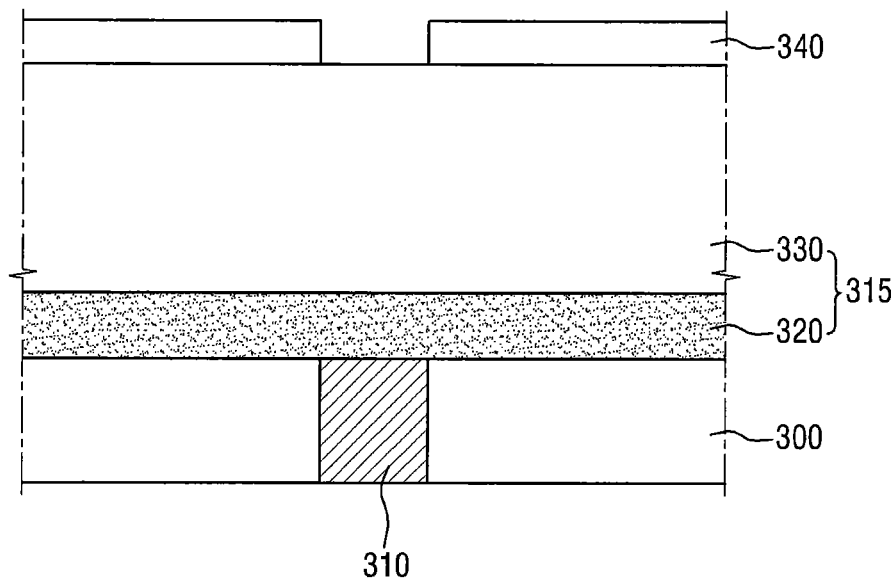
FIGS. 13 to 16 are cross-sectional views illustrating intermediate process operations in methods for fabricating semiconductor devices according to some embodiments of the present inventive concept.

Referring to FIG. 13, a second mold structure 315 may be formed on a lower layer 300 including a first conductive pattern 310.

The second mold structure 315 may include a second etch stop layer 320 and a second mold layer 330. The second etch stop layer 320 and the second mold layer 330 may be sequentially formed on the lower layer 300.

The second etch stop layer 320 and the second mold layer 330 may be substantially similar to the first etch stop layer 210 and the first mold layers 220 and 230, and the following description will focus on differences between the second etch stop layer 320 and the first etch stop layer 210 and between the second mold layer 330 and the first mold layers 220 and 230.

The lower layer 300 may include, for example, an insulating material. The lower layer 300 may include, for example, one selected from the group consisting of silicon oxide, silicon nitride, silicon oxynitride and combinations thereof.

The first conductive pattern 310 may be, for example, a wiring and/or a contact plug, but not limited thereto. The first conductive pattern 310 may include, for example, at least one of polysilicon, a metal silicide compound, conductive metal nitride and a metal, but not limited thereto.

In the methods of fabricating semiconductor devices according to some embodiments of the present inventive concept, the second mold layer 330 may include an undoped oxide layer.

A second mask pattern 340 may be formed on the second mold structure 315. The second mask pattern 340 may include an opening for forming a trench in the second mold structure 315.

Figure 14:
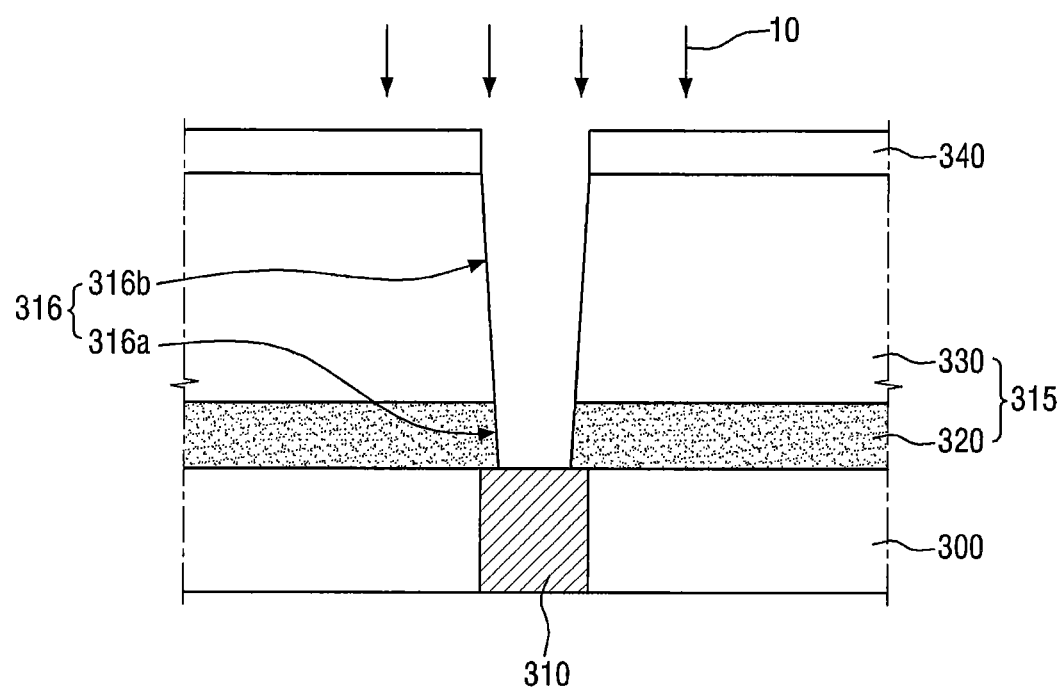

Referring to FIG. 14, a third trench 316 may be formed in the second mold structure 315 using the second mask pattern 340. The third trench 316 may be formed using, for example, dry etching 10.

The third trench 316 may expose a first conductive pattern 310 included in the lower layer 300.

The third trench 316 may include a first portion 316a of the third trench 316 and a second portion 316b of the third trench 316. The first portion 316a of the third trench 316 may be formed in the second etch stop layer 320 and the second portion 316b of the third trench 316 may be formed in the second mold layer 330.

The second portion 316b of the third trench 316 in the second mold layer 330 and the first portion 316a of the third trench 316 in the second etch stop layer 320 may be sequentially formed by dry etching 10 using the second mask pattern 340, thereby forming the third trench 316 in the second mold structure 315.

Figure 15:
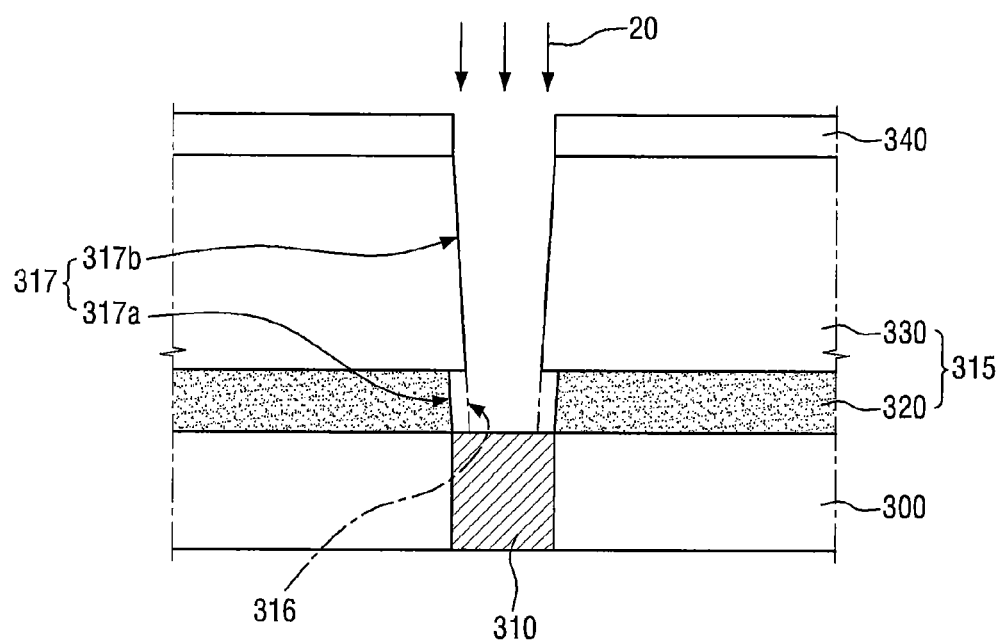

Referring to FIG. 15, a fourth trench 317 may be formed in the second mold structure 315 using wet etching 20.

The fourth trench 317 may include a first portion 317a of the fourth trench 317 and a second portion 317b of the fourth trench 317. The first portion 317a of the fourth trench 317 may be formed in the second etch stop layer 320 and the second portion 317b of the fourth trench 317 may be formed in the second mold layer 330.

The first portion 317a of the fourth trench 317 may be formed by extending a width of the first portion 316a of the third trench 316 in the second etch stop layer 320 using the wet etching 20. However, the second portion 317b of the fourth trench 317 formed in the second mold layer 330 may be substantially similar to the second portion 316b of the third trench 316. In other words, the second mold layer 330 included in the second mold structure 315 may not be substantially etched by the wet etching 20, but aspects of the present disclosure are not limited thereto.

Figure 16:
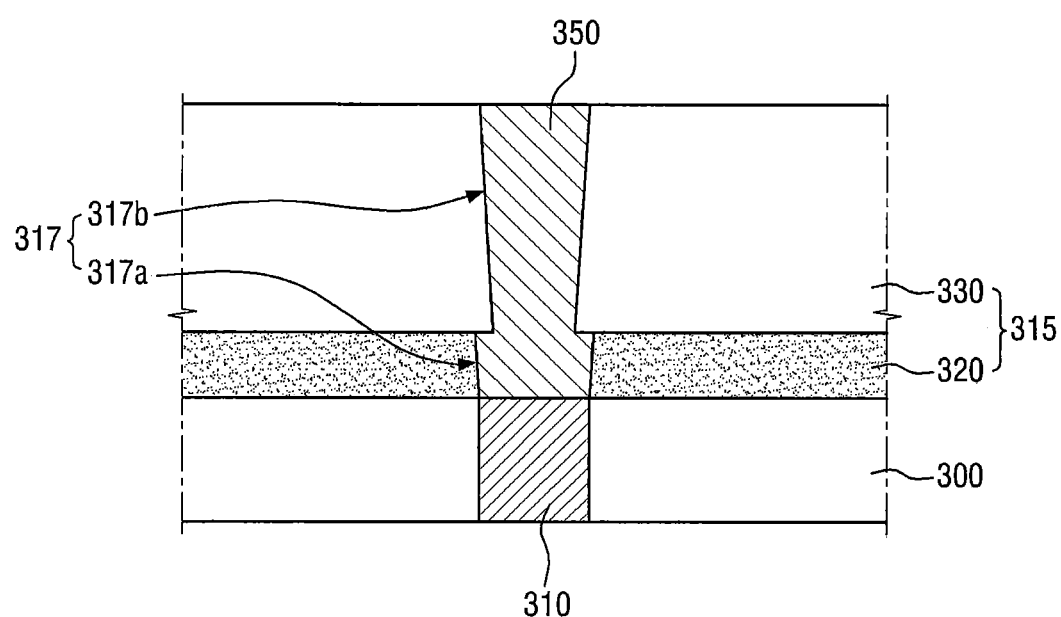

Referring to FIG. 16, a second conductive pattern 350 may be formed in the fourth trench 317. The second conductive pattern 350 may be formed in the second mold structure 315.

In detail, a conductive layer may be formed on a top surface of the second mold structure 315 while filling the fourth trench 317.

While removing the conductive layer formed on the top surface of the second mold structure 315 using CMP, the second mask pattern 340 formed on the second mold structure 315 may be removed.

The second conductive pattern 350 may include, for example, at least one of polysilicon, a metal silicide compound, conductive metal nitride and a metal, but not limited thereto.

Figure 17:
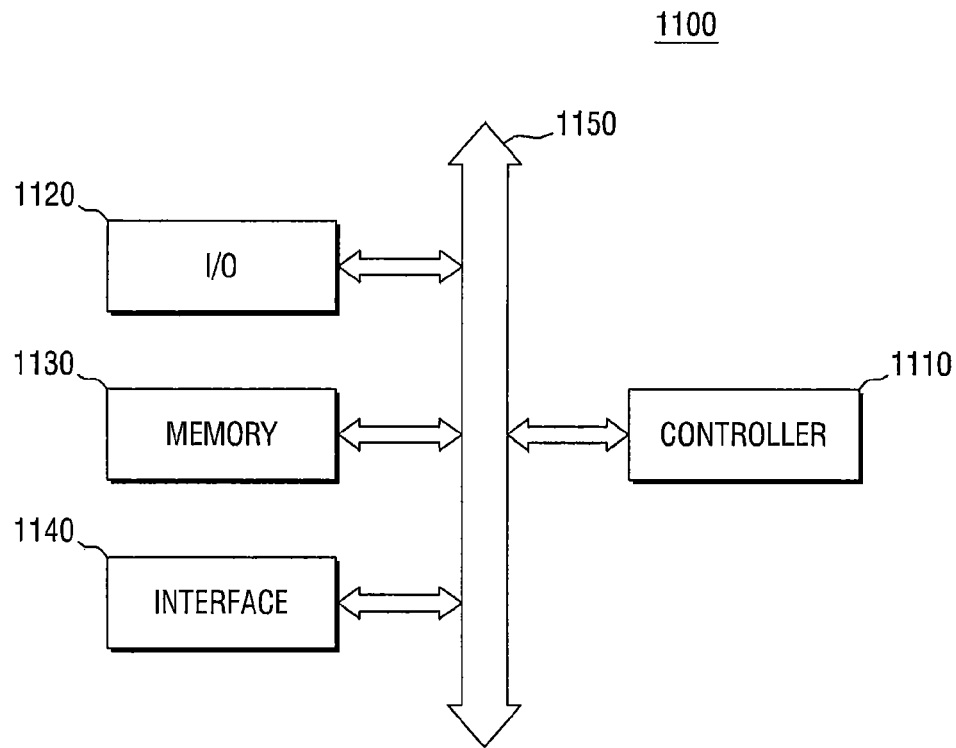
FIG. 17 is a schematic block diagram illustrating an electronic system including semiconductor devices fabricated by semiconductor device fabrication methods according to some embodiments of the present inventive concept.

FIG. 17 is a schematic block diagram illustrating an electronic system including semiconductor devices fabricated by semiconductor device fabrication methods according to some embodiments of the present inventive concept.

Referring to FIG. 17, an electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 may correspond to a path through which data moves.

The controller 1110 may include at least one of a microprocessor, a digital signal processor, a microcontroller, and logic elements capable of functions similar to those of these elements. The I/O 1120 may include a key pad, a keyboard, a display device, and so on. The memory device 1130 may store data and/or commands. The memory device 1130 may include semiconductor devices according to some embodiments of the present inventive concept. The memory device 1130 may include, for example, a DRAM. The interface 1140 may perform functions of transmitting data to a communication network and/or receiving data from the communication network. The interface 1140 may be wired and/or wireless. For example, the interface 1140 may include an antenna and/or a wired/wireless transceiver, and so on.

The electronic system 1100 may be applied to a personal digital assistant (PDA), a portable computer, a web tablet, a wireless phone, a mobile phone, a digital music player, a memory card, and/or any type of electronic device capable of transmitting and/or receiving information in a wireless environment.

Figure 18:
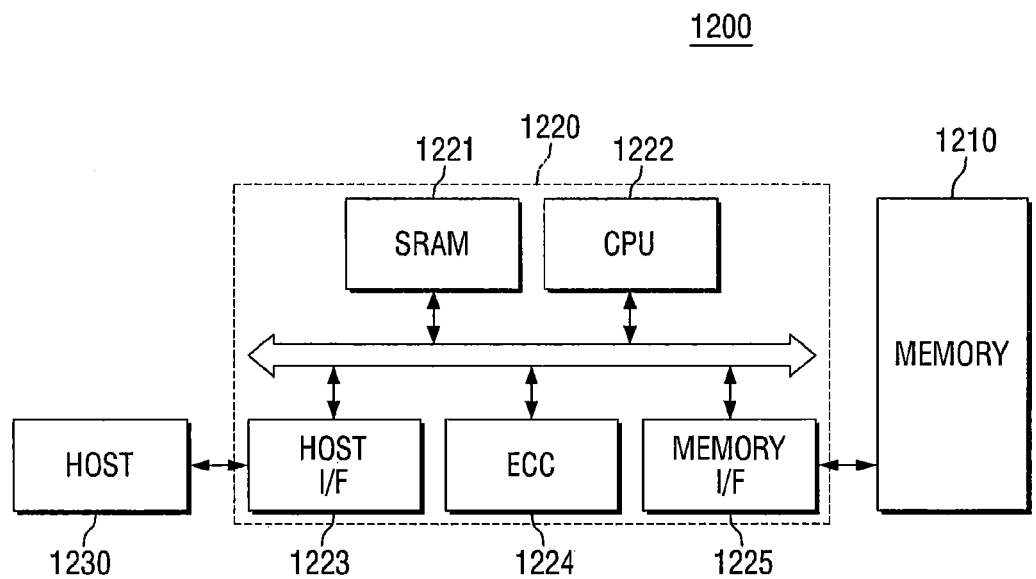
FIG. 18 is a schematic block diagram illustrating a memory card including semiconductor devices fabricated by semiconductor device fabrication methods according to some embodiments of the present inventive concept.

FIG. 18 is a schematic block diagram illustrating a memory card including semiconductor devices fabricated by semiconductor device fabrication methods according to some embodiments of the present inventive concept.

Referring to FIG. 18, a memory 1210 fabricated according to various embodiments of the present inventive concept may be employed to a memory card 1200. The memory card 1200 fabricated according to some embodiments of the present inventive concept may include a memory controller 1220 controlling data exchange between a host 1230 and the memory 1210. A static random access memory (SRAM) 1221 may be used as a working memory of a central processing unit 1222. A host interface 1223 may include a data exchange protocol of the host 1230 connected to the memory card 1200. An error correction block 1224 detects and corrects an error included in data read from the memory 1210. A memory interface 1225 interfaces with the memory 1210 according to the present inventive concept. The central processing unit 1222 performs an overall controlling operation for data exchange of the memory controller 1220.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. The present embodiments are therefore illustrative and not restrictive.

What is claimed is:

1. A method of fabricating a semiconductor device, the method comprising:
   forming a mold structure on a lower layer, the mold structure comprising an etch stop layer doped with a first impurity at a first impurity concentration on the lower layer, a lower mold layer doped with a second impurity at a second impurity concentration on the etch stop layer, and an undoped upper mold layer on the lower mold layer;
   forming a first trench exposing the lower layer in the mold structure using dry etching;
   forming a second trench in the mold structure using wet etching by expanding a width of the first trench in the etch stop layer; and
   forming a first conductive pattern in the second trench,
   wherein an etch rate of the etch stop layer with respect to the dry etching is smaller than an etch rate of the lower mold layer with respect to the dry etching, and
   wherein an etch rate of the etch stop layer with respect to the wet etching is proportional to the first impurity concentration.

2. The method of claim 1, wherein the etch rate of the etch stop layer with respect to the wet etching increases according to an increase in the first impurity concentration.

3. The method of claim 1, wherein the first impurity and the second impurity comprise boron (B).

4. The method of claim 1, wherein the wet etching expands a width of the first trench in the lower mold layer.

5. The method of claim 1, wherein in the upper mold layer, a width of the first trench and a width of the second trench are substantially equal.

6. The method of claim 1, wherein the forming of the first conductive pattern comprises:
   forming a conductive layer along sidewalls and a bottom surface of the second trench and a top surface of the mold structure; and
   removing the conductive layer formed on the top surface of the mold structure.

7. The method of claim 1, wherein the forming of the first conductive pattern comprises:
   forming a conductive layer filling the second trench in the mold structure; and
   removing the conductive layer formed on the top surface of the mold structure.

8. The method of claim 1, further comprising:
   forming a high-k dielectric layer on the first conductive pattern; and
   forming a second conductive pattern on the high-k dielectric layer.

9. A method of fabricating a semiconductor device, the method comprising:
   forming an interlayer insulation layer on a substrate, the substrate comprising an impurity region;
   forming a contact plug connected to the impurity region in the interlayer insulation layer;
   forming an etch stop layer doped with an impurity on the interlayer insulation layer, a lower mold layer doped with the impurity on the etch stop layer, and an upper mold layer on the lower mold layer;
   forming a trench that exposes the contact plug, the trench comprising a first trench portion in the upper mold layer, a second trench portion in the lower mold layer and a third trench portion in the etch stop layer;
   expanding a width of the second trench portion and a width of the third trench portion;
   forming a lower electrode in the first trench portion, the expanded second trench portion and the expanded third trench portion;
   after forming the lower electrode, exposing the etch stop layer by removing the lower mold layer and the upper mold layer; and
   forming a capacitor dielectric layer and an upper electrode on the lower electrode and on a top surface of the exposed etch stop layer,
   wherein a ratio of a width of the expanded third trench portion to a width of the expanded second trench portion is proportional to a concentration of the impurity doped into the etch stop layer.

10. The method of claim 9, wherein the concentration of the impurity doped into the lower mold layer is constant, and the ratio of the width of the expanded third trench portion to the width of the expanded second trench portion increases according to an increase in the concentration of the impurity doped into the etch stop layer.

11. The method of claim 9, wherein the impurity comprises boron (B).

12. The method of claim 9, wherein the forming of the expanded second trench portion and the expanded third trench portion comprises selectively etching the etch stop layer and the lower mold layer using wet etching.

13. The method of claim 12, wherein the upper mold layer is not substantially etched using the wet etching.

14. The method of claim 9, wherein the forming of the lower electrode comprises:
    forming a lower electrode layer along sidewalls of the first trench portion, sidewalls of the expanded second trench portion, sidewalls of the expanded third trench portion and a top surface of the upper mold layer;
    forming a sacrificial layer filling the first trench, the expanded second trench portion and the expanded third trench portion; and
    removing a portion of the lower electrode layer on the top surface of the upper mold layer,
    wherein the capacitor dielectric layer and the upper electrode are formed along inner sidewalls and outer sidewalls of the lower electrode, respectively.

15. The method of claim 9, wherein the forming of the lower electrode comprises:
    forming a lower electrode layer filling the first trench portion, the expanded second trench portion, the expanded third trench portion, and on a top surface of the upper mold layer; and
    removing the lower electrode layer from the top surface of the upper mold layer,
    wherein the capacitor dielectric layer and the upper electrode are formed along an outer circumferential surface of the lower electrode.

16. A method of fabricating a semiconductor device, the method comprising:
    forming an interlayer insulation layer comprising an electrically conductive contact plug;
    forming an etch stop layer doped with an impurity on the interlayer insulation layer;
    forming a lower mold layer doped with the impurity on the etch stop layer;
    forming an undoped upper mold layer on the lower mold layer;
    forming a trench through the upper mold layer, the lower mold layer, and the etch stop layer using a dry etch process, the trench comprising a first trench portion in the etch stop layer, a second trench portion in the lower mold layer, and a third trench portion in the upper mold layer and exposing the conductive contact plug;
    increasing a width of the first trench portion and a width of the second trench portion with respect to a width of the third trench portion using a wet etch process;
    forming a first electrode in the trench and contacting the conductive contact plug;
    removing the mold layer to expose portions of the first electrode;
    forming a dielectric layer on the first electrode; and
    forming a second electrode on the dielectric layer,
    wherein a width after the wet etch process of the first trench portion is proportional to a concentration of the impurity doped into the etch stop layer.

17. The method of claim 16,
    wherein the forming the first electrode comprises forming a conductive layer along sidewalls and a bottom surface of the trench, and
    wherein the forming the dielectric layer and the forming the second electrode comprise sequentially forming the dielectric layer and the second electrode on inside and outside surfaces of the first electrode.

18. The method of claim 16, wherein a width after the dry etch process of the first trench portion is not proportional to the concentration of the impurity doped into the etch stop layer.

19. The method of claim 16, wherein the upper mold layer comprises an oxide, the lower mold layer comprises the oxide, the etch stop layer comprises a nitride, and the impurity comprises boron.

20. The method of claim 16,
    wherein the forming the first electrode comprises filling the trench with a conductive material, and
    wherein the forming the dielectric layer and the forming the second electrode comprise sequentially forming the dielectric layer and the second electrode on an outer surface of the first electrode.

* * * * *